(12) United States Patent
Sato et al.

(10) Patent No.: US 7,283,939 B2
(45) Date of Patent: Oct. 16, 2007

(54) METHOD, SYSTEM AND PROGRAM FOR SUPPORTING MECHANISM DESIGN

(75) Inventors: Seiki Sato, Tokyo (JP); Hikaru Murata, Tokyo (JP); Tokimune Kuroiwa, Tokyo (JP); Masaru Tange, Tokyo (JP); Shinpei Muraoka, Tokyo (JP)

(73) Assignee: INCS Inc., Kanagawa (JP)

( * ) Notice: Subject to any disclaimer, the term of this patent is extended or adjusted under 35 U.S.C. 154(b) by 520 days.

(21) Appl. No.: 10/840,393

(22) Filed: May 5, 2004

(65) Prior Publication Data

US 2004/0236446 A1    Nov. 25, 2004

(30) Foreign Application Priority Data

May 14, 2003   (JP)   ............................. 2003-135405

(51) Int. Cl.
 *G06F 17/50* (2006.01)
 *G06G 7/48* (2006.01)
(52) U.S. Cl. ............................................. 703/1; 703/6
(58) Field of Classification Search .................... 703/1, 703/6
 See application file for complete search history.

(56) References Cited

U.S. PATENT DOCUMENTS 6,295,513 B1 * 9/2001 Thackston ..................... 703/1

FOREIGN PATENT DOCUMENTS

JP          8-6982          1/1996

OTHER PUBLICATIONS

Toru Arizumi, Establishment of Design Standards Incorporating Design Rationales, and Construction of Semi-Automatic System, Nikkei Mechanical, Sep. 1999, vol. No. 540, pp. 52-53 (1999).
Koichi Kondo et al, Mechatronics Codesign Based on Design Task Analysis and Information-Sharing, (1999), vol. 54, No. 9.
Support of Document/Human-Based Information-Sharng by IT (Nikkei Digital Engineering) Jun. 2000 pp. 76-81.
Partial English translation attached for all 3 citations.

* cited by examiner

*Primary Examiner*—Hugh Jones
(74) *Attorney, Agent, or Firm*—Martin Fleit; Paul D. Bianco; Fleit Kain Gibbons Gutman Bongini & Bianco, P.L.

(57) ABSTRACT

Informations about design specifications, components, design items, the correlations between the design specifications and the components, and the correlations between the design items and the design specifications or between the design items and the component, which are required for designing a product, are registered in a database while giving given definitions to the informations on a computer. A computer is used to prompt a design engineer to determine the content of the design specification with respect to a specific version of the product, and to extract components for the specific version from the database in accordance with the correlations between the design specifications and the components and present the extracted components to an engineer so as to prompt the engineer to determine components required for the specific version. Further, design items required for the specific version are extracted on a computer in accordance with the correlations between the design items and the design specifications or between the design items and the component.

12 Claims, 31 Drawing Sheets

FIG.8

ADD NECESSARY CONDITION

DESIGN ITEM SUBJECT TO ADDITION OF NECESSARY CONDITION: Design Item 1-1-1

UNIT SELECTION: Body

COMPONENT LIST

| Sub-Unit Name | Component Name | Component Type Name | Component Number | Cost | Material |
|---|---|---|---|---|---|
| ☐ | component 1 | type A | IN0001 | 100 | ABS |
| ☐ | component 1 | type B | IN0002 | 120 | ABS |
| ☐ | component 2 | type A | IN0001 | 30 | ABS |
| ☐ | component 2 | type B | IN0002 | 20 | ABS |
| ☐ | component 3 | type A | IN0005 | 50 | ABS |
| ☐ | component 3 | type B | IN0006 | 60 | ABS |
| ☐ | component 4 | type A | IN0007 | 80 | ABS |
| ☐ | component 4 | type B | IN0008 | 90 | ABS |
| ☐ | component 5 | type A | IN0009 | 200 | ABS |
| ☐ | component 5 | type B | IN0010 | 210 | ABS |
| ☐ | component 6 | type A | IN0011 | 140 | ABS |
| ☐ | component 6 | type B | IN0012 | 100 | ABS |
| ☐ | component 7 | type A | IN0013 | 10 | ABS |
| ☐ | component 7 | type B | IN0014 | 15 | ABS |
| ☐ | component 8 | type A | IN0015 | 50 | ABS |
| ☐ | component 8 | type B | IN0016 | 70 | ABS |

CLEAR

DESIGN INFORMATION LIST

| Design Information Name | Design Information Value | Unit |
|---|---|---|
| ☑ design specification 1 | value 1a | - |
| ☐ design specification 1 | value 1b | - |
| ☐ design specification 2 | value 2a | - |
| ☐ design specification 2 | value 2b | - |
| ☐ design specification 3 | value 3a | - |
| ☐ design specification 3 | value 3b | - |
| ☐ design specification 4 | value 4a | - |
| ☐ design specification 4 | value 4b | - |
| ☐ design specification 5 | value 5a | - |
| ☐ design specification 5 | value 5b | - |
| ☐ evaluation measure 1 | value 1α | - |
| ☐ evaluation measure 1 | value 1β | - |
| ☐ evaluation measure 2 | value 2α | - |
| ☐ evaluation measure 2 | value 2β | - |
| ☐ evaluation measure 3 | value 3α | - |
| ☐ evaluation measure 3 | value 3β | - |

CLEAR

APPLY   CANCEL

FIG.14

CONCEPT DESIGN INFORMATION INPUT WINDOW

After selecting design information value, push the Registration/Update button

VERSION NAME: development-02

REFERENTIAL VERSION NAME: [          ]   PAGE: 1/2   <<   >>

| | DESIGN INFORMATION ITEM | REFERENCE VALUE | DESIGN VALUE | UNIT |
|---|---|---|---|---|
| 1 | design specification 1 | | | |
| 2 | design specification 2 | | | |
| 3 | design specification 3 | | | |
| 4 | design specification 4 | | | |
| 5 | design specification 5 | | | |

COMMENT: Comment on Design Specification 1

[REGISTRATION/UPDATE] [COMPONENT REGISTRATION] [INFORMATION INPUT] [CANCEL] [DATA OUTPUT] [RETURN]

FIG.15

CONCEPT DESIGN INFORMATION INPUT WINDOW

After selecting design information value, push the Registration/Update button

VERSION NAME: development-02

REFERENTIAL VERSION NAME: version-01   PAGE: 1/2   <<   >>

| | DESIGN INFORMATION ITEM | REFERENCE VALUE | DESIGN VALUE | UNIT |
|---|---|---|---|---|
| 1 | design specification 1 | value 1a | value 1a | |
| 2 | design specification 2 | value 2b | value 2b | |
| 3 | design specification 3 | value 3a | value 3a | |
| 4 | design specification 4 | value 4b | value 4b | |
| 5 | design specification 5 | value 5b | value 5b | |

COMMENT: Comment on Design Specification 1

[REGISTRATION/UPDATE] [COMPONENT REGISTRATION] [INFORMATION INPUT] [CANCEL] [DATA OUTPUT] [RETURN]

FIG.28

DESIGN PROCESS LIST

DESIGN PROCESS LIST WINDOW

| Component Name | Component Position Name | Design Item Name | Status | Design Engineer | Date |
|---|---|---|---|---|---|
| component 1 | component position 1-1 | design item 1-1-1 | design completion | unknown | 2002/08/01 11:16:28 |
| | | design item 1-1-2 | designable | unknown | 2002/08/01 11:12:28 |
| component 2 | component position 2-1 | design item 2-1-1 | designable | unknown | |
| | component position 2-2 | design item 2-2-1 | undesignable | unknown | |
| | | design item 2-2-2 | undesignable | unknown | |
| component 3 | component position 3-1 | design item 3-1-1 | designable | unknown | 2002/08/01 11:12:28 |
| component 4 | component position 4-1 | design item 4-1-1 | undesignable | unknown | |
| | component position 4-2 | design item 4-2-1 | undesignable | unknown | |
| component 5 | component position 5-1 | design item 5-1-1 | undesignable | unknown | |
| component 6 | component position 6-1 | design item 6-1-1 | designable | unknown | 2002/08/01 11:12:28 |
| | | design item 6-1-2 | undesignable | unknown | |
| component 7 | component position 7-1 | design item 7-1-1 | undesignable | unknown | |
| | component position 7-2 | design item 7-2-1 | undesignable | unknown | |
| component 8 | component position 8-1 | design item 8-1-1 | undesignable | unknown | |

UNIT SELECTION: display all

COMPONENT SELECTION: display all

[INFORMATION DISPLAY] [DESIGN FLOW DISPLAY] [END DECLARATION] [RETURN]

FIG.32

DESIGN PROCESS LIST

DESIGN PROCESS LIST WINDOW

| Component Name | Component Position Name | Design Item Name | Status | Design Engineer | Date |
|---|---|---|---|---|---|
| component 1 | component position 1-1 | design item 1-1-1 | design completion | unknown | 2002/08/01 11:16:28 |
| | | design item 1-1-2 | design completion | unknown | 2002/08/01 11:16:46 |
| | | design item 1-1-1 | designable | unknown | 2002/08/01 11:18:16 |
| component 2 | component position 2-1 | design item 2-1-1 | design completion | unknown | 2002/08/01 11:16:53 |
| | component position 2-2 | design item 2-2-1 | design completion | unknown | 2002/08/01 11:17:00 |
| | | design item 2-2-2 | design completion | unknown | 2002/08/01 11:18:16 |
| component 3 | component position 3-1 | design item 3-1-1 | design completion | unknown | 2002/08/01 11:17:09 |
| component 4 | component position 4-1 | design item 4-1-1 | designable | unknown | 2002/08/01 11:17:29 |
| | component position 4-2 | design item 4-2-1 | designable | unknown | 2002/08/01 11:17:09 |
| component 5 | component position 5-1 | design item 5-1-1 | designable | unknown | 2002/08/01 11:17:09 |
| component 6 | component position 6-1 | design item 6-1-1 | undesignable | unknown | 2002/08/01 11:12:28 |
| | | design item 6-1-2 | undesignable | unknown | |
| component 7 | component position 7-1 | design item 7-1-1 | undesignable | unknown | |
| | component position 7-2 | design item 7-2-1 | undesignable | unknown | |
| component 8 | component position 8-1 | design item 8-1-1 | undesignable | unknown | |

UNIT SELECTION: display all

COMPONENT SELECTION: display all

INFORMATION DISPLAY | DESIGN FLOW DISPLAY | END DECLARATION | RETURN

FIG.33
(a)
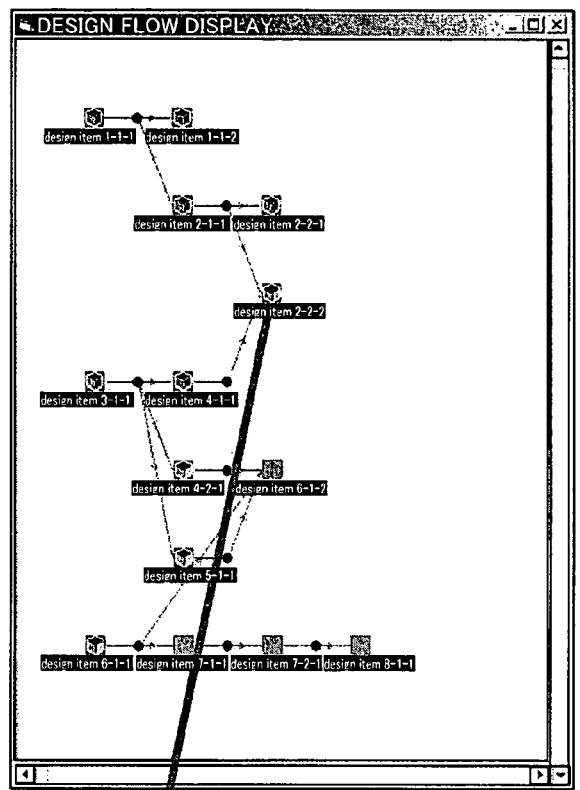
(b)
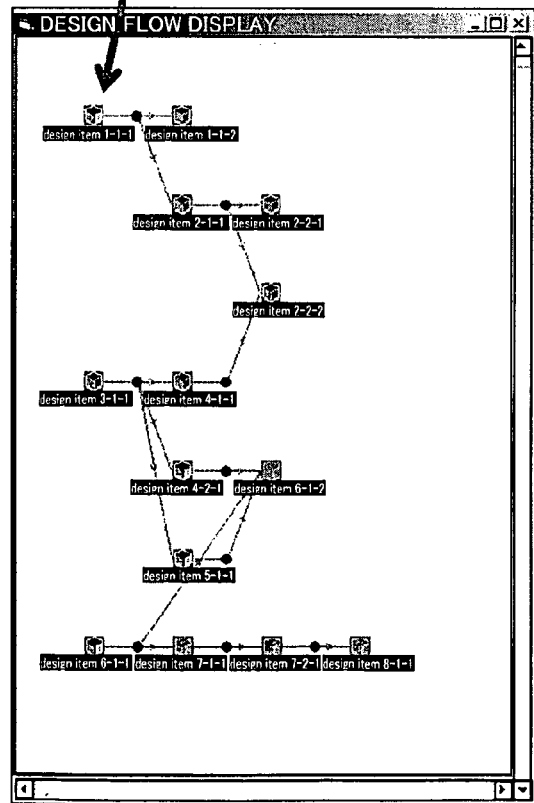

(a)

(b)

(c)

METHOD, SYSTEM AND PROGRAM FOR SUPPORTING MECHANISM DESIGN

BACKGROUND OF THE INVENTION

1. Field of the Invention

The present invention relates to a mechanism-design support method, system and program for presenting job content to an operator who performs the mechanism design of a specific version of a product, and guiding or navigating the operator in various manners.

2. Prior Art

Heretofore, in designing a new product, the mechanisms of the product have been designed by determining various parameters, such as physical shapes, dimensions, required components and the positional relationship between the components, on a trial-and-error basis. Therefore, one design engineer can acquire techniques for designing within a short period of time while maintaining a standard or higher level of design quality only after the design engineer designs a product family belonging to the same category over and over again. While such repeated experience in design of a product family belonging to the same category allows design engineers to familiarize themselves with the design of the product family and acquire design knowhow individually, the knowhow is generally accumulated only in the individual design engineer, and hardly shared between other design engineers.

Under a situation where the demands of product purchasers become diversified, and a large-item small-scale production is generalized, it is required to continuously bring various versions of one product to the market within a short period of time even if the product versions fall into the same category, which leads to a strong need for drastically reducing the period required for designing each of the versions. Thus, in a variety of product design fields, it becomes critical to allow even inexperienced design engineers to design various versions at a standard or higher level of quality within a short period of time.

It is therefore an object of the present invention to provide a technology capable of complying with such needs.

SUMMARY OF THE INVENTION

In order to achieve the above object, the present invention provides a mechanism-design support method, system and program for supporting a design engineer who performs the mechanism design of a certain product, by use of a computer.

The method comprises a setup step of registering in a database informations about design specifications, components, design items, the correlations between the design specifications and the components, and the correlations between the design items and the design specifications or between the design items and the components, which are required for the mechanical design of the product, while giving given definitions to the informations on a computer. Specifically, in the development/design of a certain product, informations about design items, design items and components, which are required for the mechanism design the product, are collected through inquiry/interview with engineers knowledgeable about the design of the product, and the collected informations are registered in a database.

The method further includes: a design-specification determination step of using a computer to prompt the operator to determine the content of the design specifications with respect to a specific version of the product; a component determination step of extracting components for the specific version from the database in accordance with the design specification-component correlations registered in the setup step, and presenting the extracted components to the operator on a computer so as to prompt the operator to determine components required for the specific version while performing addition, alteration and/or deletion on components if required; a design-item extraction step of using a computer to extract design items required for the specific version in accordance with the design item-design specification correlations or the design item-component correlations registered in the setup step, and present the extracted design items to the operator; and a design-item execution step of using a computer to present to the operator specific job content of each of the design items extracted in the design-item extraction step, and navigate and prompt the operator to execute the job content.

The temporal relationship between the design items may be defined in the setup step, so that a design flow diagram for the design items extracted in the design-item extraction step can be created on a computer in accordance with the above temporal relationship. For example, the temporal relationship may be defined by specify any of the design items which must have been completed to enable one or more of the remaining design items to be executed, or any of said design items which becomes executable only after the completion of one or more of the remaining design items.

Further, the setup step may include storing a document related to one or more of the design items, and data on the correlation between the document and the one or more design items, and the design-item execution step may include extracting the content of the document correlated with the design item subject to a specific job to be executed by the operator, if any, in accordance with the correlation data, and presenting the document to the operator.

Furthermore, the design-item execution step may includes allowing the completed design item to be returned to its uncompleted or designable status while maintaining obtained data, so as to redo the job for this design item.

Other objects and advantages of the present invention will be understood from the following description of some preferred embodiments, which are shown in accompanying drawings:

FIG. 8 is a diagram showing a window displaying all of the registered specifications and components;

FIG. 14 is a diagram showing a dialog box on a "Concept Design information Input Window";

FIG. 15 is a diagram showing the dialog box on the "Concept Design information Input Window", wherein a design value of a registered version to be displayed when the registered version is selected as a referential version, is displayer in a "Reference Value" field;

FIG. 28 is a diagram showing a matrix window for defining the correlation between a design specification and a component;

FIG. 32 is a diagram showing a new Design Process List Window to be displayed in response to clicking on a "YES" button in the confirmation window in FIG. 31;

FIG. 33 is a diagram showing the change in design flow between before and after the return function is used;

DESCRIPTION OF PREFERRED EMBODIMENTS

With reference to the drawings, a design navigation system achieved as one embodiment of the present invention. The design navigation system according to this embodiment fundamentally comprises a computer, and a computer program executable on the computer. That is, the design navigation system can be established by combining a computer and a computer program executable on the computer.

The design navigation system according to this embodiment generally includes two operational modes: "setup mode" and "execution mode". The "setup mode" herein means a mode for registering various informations about a certain product, such as a portable phone, to a database while correlating with each other on a computer. For example, these informations include: design specifications required for a specific mechanism design, such as the overall and local physical shapes of the product, components supposed to be used, the positional relationship between the components, and strength required for each portion of the product; mechanism components supposed to be used; and design items supposed to involve design jobs. In other words, the "setup mode" means a mode for preparing informations required for navigating a design job of a mechanism design engineer, in advance of the execution of the design job.

The "execution mode" herein means a mode for extracting the design items, design specifications and mechanism components required for the mechanism design of a specific version of a certain product (e.g. specific one of plural versions of a product such as a portable phone), and navigating an operator who actually executes a design job, for example, on a CAD system.

In view of the content of the design job, the execution mode is divided into "concept design" and "detailed design". In the "concept design", the design items required for the mechanism design of the version are extracted and then a design flow indicating the execution sequence of the extracted design items is created. In the "detailed design", according to the design flow created from the concept design, each of the design items subject to the mechanism design is presented to a detailed design engineer from time to time so as to prompt the detailed design engineer to execute required design jobs included in the presented design item. It is understood that the above classification divided into the "concept design" and the "detailed design" is no more than one example, and the present invention is not limited to such a classification. For example, the execution mode may be configured as one series of procedure or may be divided into three or more sub-modes. It is intended that such modifications are also encompassed within the scope of the present invention.

Figure 1:
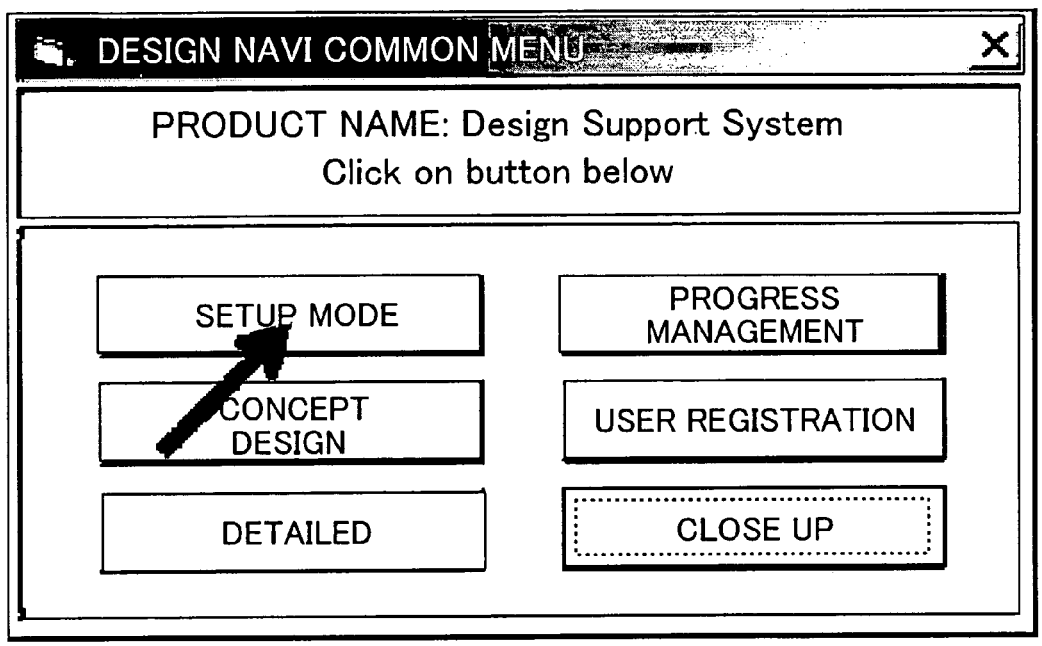
FIG. 1 is a diagram showing a window displaying select buttons including a "Setup Mode" button, "Concept Design" button and "Detailed Design" button.

Upon activation of the design navigation system according to this embodiment, a login window (not shown) is first displayed on a display screen. When an authorized user or operator enters his/her name and password through the login window and then clicks on an OK button of the login window, a dialog box as shown in FIG. 1 is displayed. This dialog box is configured to display a plurality of select buttons associated with the above "setup mode", "concept design" and "detailed design", and allow an operator to click on any of the select buttons so as to select any of the modes. The following description on the design navigation system according to this embodiment will be made in conjunction with the "setup mode", "concept design" and "detailed design" in this order.

[Setup Mode]

Figure 2:
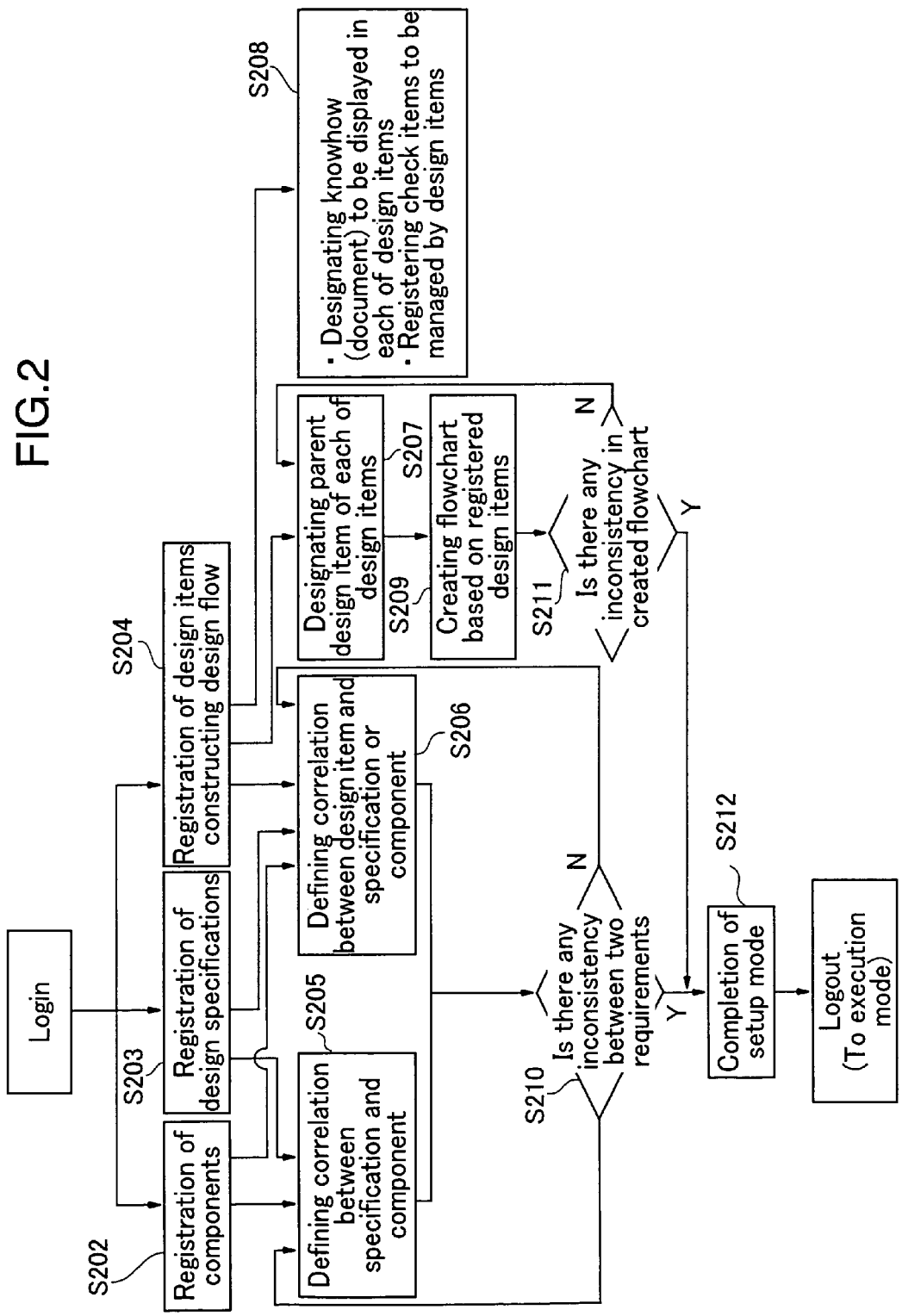
FIG. 2 is a flowchart showing the entire process of an operation in a setup mode.

As described above, in the setup mode, the informations required for navigating design jobs of a design engineer primarily in the concept design and the detailed design are prepared on a computer in advance of the execution of the design jobs, and registered in a database. FIG. 2 is a flowchart showing the entire procedure of the setup mode. The following description shows one case where this setup mode is used to set up informations required in a system for supporting an operator who performs the mechanism design of a portable phone.

Even if plural versions of a product are categorized as portable phones, all of the versions will be obviously different in design content. However, as long as the product versions fall into the same category of portable phones, they have a lot in common in terms of design content. From this point of view, fundamental informations about the mechanism design of products belonging to the category of portable phones will be registered in the setup mode.

Figure 3:
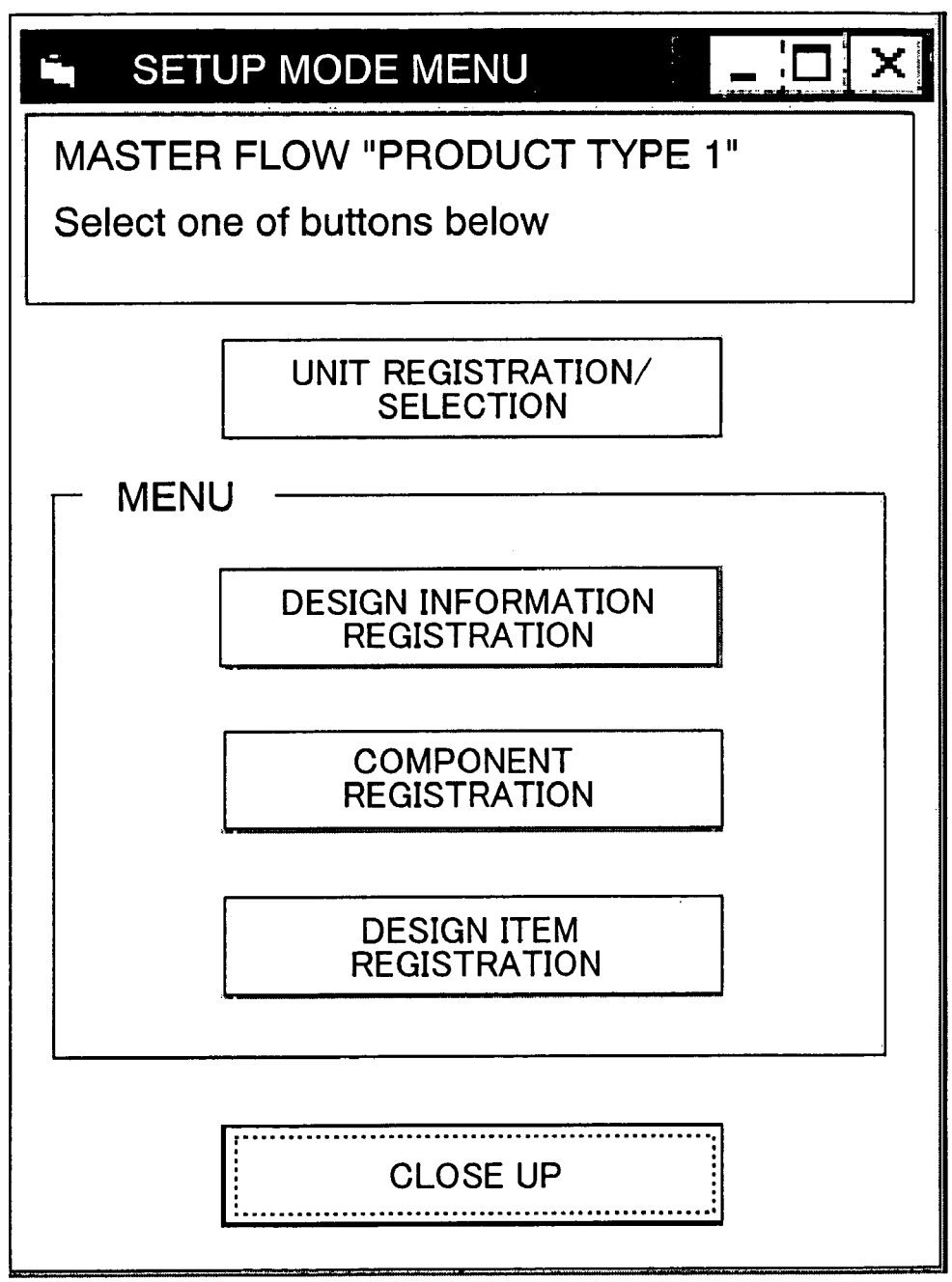
FIG. 3 is a diagram showing a window for selecting either one of "design information registration", "component registration" and "design item registration" in the setup mode.

In response to clicking on a "Setup Mode" button of the dialog box in FIG. 1, the system activates the setup mode to display a window as shown in FIG. 3. The dialog box illustrated in FIG. 3 includes buttons for three options: "design information registration", "component registration" and "design item registration". The operator selectively clicks on one of the buttons which relates to a job to be executed. In this dialog box, the "design information registration" corresponds to a job described as "registration of design specifications" (S203) in the flowchart of FIG. 2. The "component registration" corresponds to a job described as "registration of components" (S202) in FIG. 2. The "design item registration" corresponds to a job described as "registration of design items constructing design flow" (S204) in FIG. 2.

Figure 4:
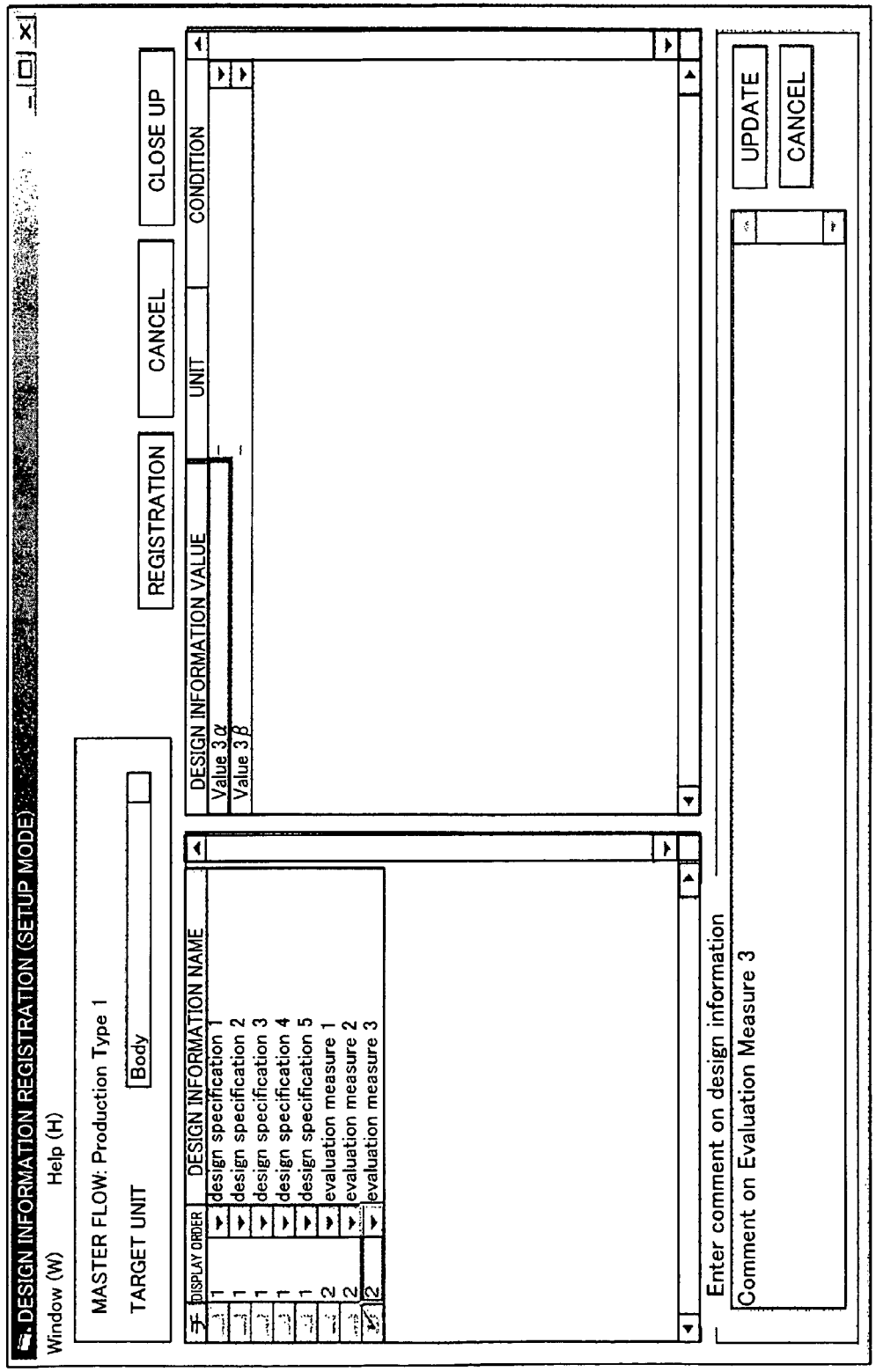
FIG. 4 is a diagram showing a dialog box for registering a design specification, which is to be displayed in response to clicking on a "Design Information registration" button in a dialog box in FIG. 3.

The "design information registration" will be first described below. When the operator clicks on the "Design Information Registration" button of the dialog box illustrated in FIG. 3, a window as shown in FIG. 4 is displayed. This window is a dialog box for registering design informations or design specifications. While design information names such as "design specification 1" have already been registered in the field titled "Design Information Name" in FIG. 4, such design information names had not been registered when the system was initially started up. A design information name can be registered by clicking on the "Design Information Name" field with the right mouse button, clicking on an "Addition" button among resulting displayed option buttons, entering an adequate name into a resulting displayed input field for design information name, and pushing the return key. Through this operation, the entered name will be immediately added in the tail of the "Design Information Name" field.

The added design information name can be registered in correlation with a "design information value" on the right side of the "Design Information Name" field. In this case, if the system is configured such that a design engineer selects suitable one of optional design information values during mechanism design, a plurality of design information values will be entered and registered to provide the options. In the example illustrated in FIG. 4, two values: "value 3α" and "value 3β", are registered as options for the design information name "evaluation measure 3". Further, any information about the "evaluation measure 3" can be written as a comment in a field indicated by "Enter comment on design information". The comment written in the field indicated by "Enter comment on design information" will be used as valuable information capable of being readily referred by an operator during the detailed design. In this manner, required design specifications are sequentially registered in the "Design Information Name" field. In conjunction with the registration of the design specifications, one or more design information values are also registered for each of the design specifications, if necessary. The registered informations will be stored in a database (DB) of the system according to a given form.

Figure 5:
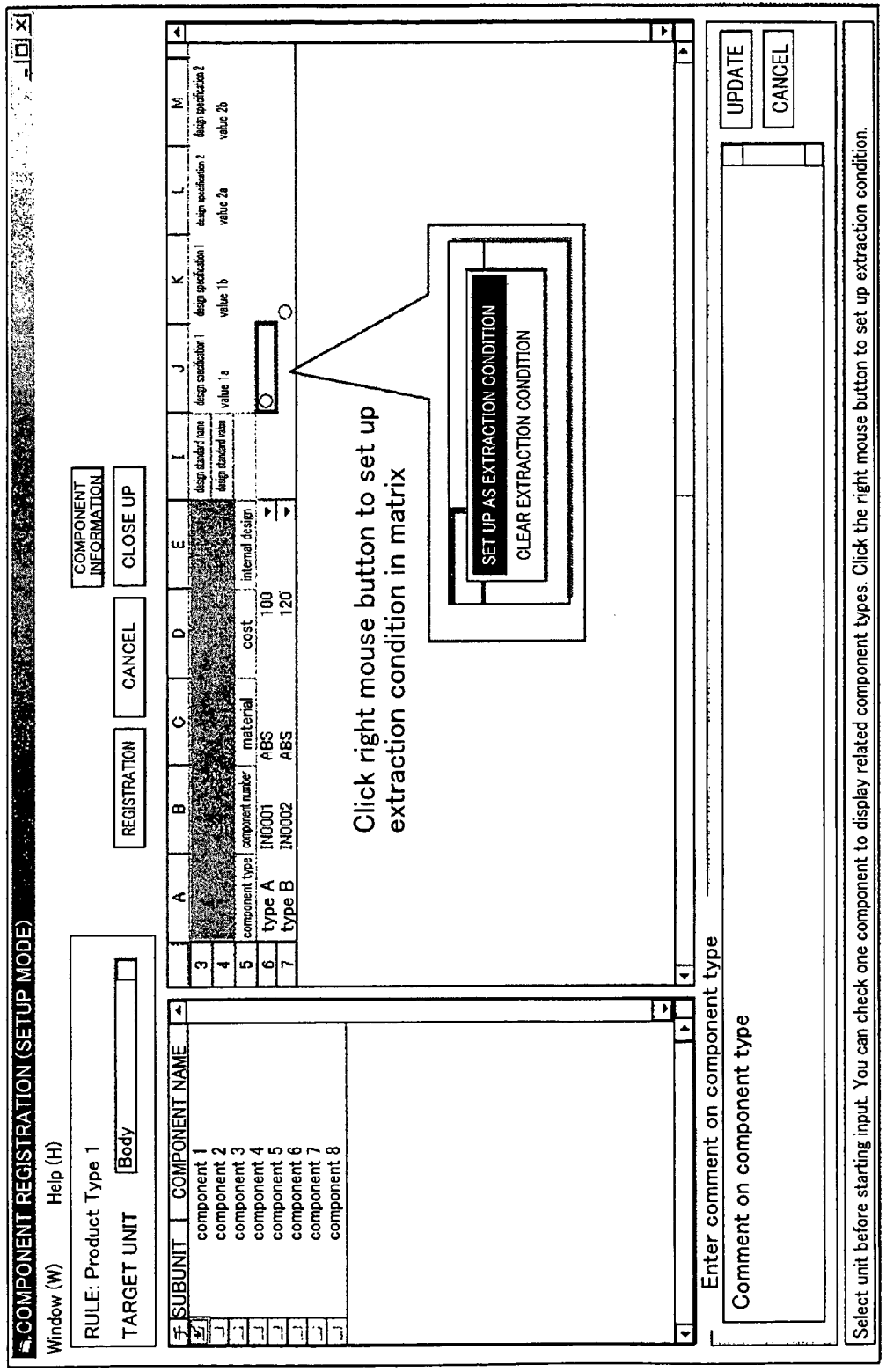
FIG. 5 is a diagram showing a dialog box for registering a component supposed to be used in the product, which is to be displayed in response to clicking on a "Component Registration" button in the dialog box in FIG. 3.

The "component registration" will be described below. When the operator clicks on the "Component Registration" button of the dialog box in FIG. 3, a window as shown in FIG. 5 is displayed (S202). This window is a dialog box for registering mechanism components supposed to be used in a product. As with the "Design Information Registration" field in FIG. 3, no component is initially registered in a field titled "Component Name" in FIG. 5. A component name can be registered by clicking on the "Component Name" field with the right mouse button, clicking on an "Addition" button among resulting displayed option buttons, entering an adequate name into a resulting displayed input field for component name, and pushing the return key. Through this operation, the entered name will be immediately added in the tail of the "Component Name" field. Thus, component names can be registered in a simple operation.

Then, information about the entered component is registered using fields on the right side of the "Component Name" field. The following description will be made in conjunction with one example where information about one specific component or "component 1" is registered. In this example, given that there is the need for preparing two types: "component type A" and "component type B. Thus, a field titled "Component Type Name" is provided in a column A on the right side of the "Component Name" field. In addition, four fields titled "Component Number", "Material", "Cost" and "Internal Design" are provided in columns B, C, D and E, respectively. These fields are configured such that an operator executing the setup mode can arbitrarily define them. Thus, the operator can enter required values or characters into these preset fields.

As for the components, it is required to define the correlation with the design specifications (S205). A column I and subsequent columns are configured as a matrix for defining the correlation. Specifically, the design specifications registered in the "Design Information Name" field and the design information value registered in conjunction therewith are displayed in the column J and subsequent columns. When the operator clicks on desired one of cells in the matrix with the right mouse button, and selects a "Set Up as Extraction Condition" button among resulting displayed option buttons, a mark "o" is displayed on the clicked cell. In the example illustrated in FIG. 5, the component defined as the "type A" of the "component 1" is correlated with the design specification defined as the "value 1α" of the "design specification 1", and the component defined as the "type B" of the "component 1" is correlated with the design specification defined as the "value 1*b*" of the "design specification 1".

In this manner, the correlation between a design specification and a component associated with the design specification can be readily defined, and this defined information will be used in the subsequent execution mode (concept design and detailed design). For example, if an operator selects the "value 1*a*" for the "design specification 1" in the detailed design, the "type A" of the "component 1" will be extracted as a component corresponding to the "value 1*a*". Otherwise, if the operator selects the "value 1*b*" for the "design specification 1", the "type B" of the "component 1" will be extracted as a component corresponding to the "value 1b". In this way, a component corresponding to a design specification can be automatically extracted by a computer in accordance with the defined correlation. This allows even inexperienced design engineers to select a required and adequate component.

Figure 6:
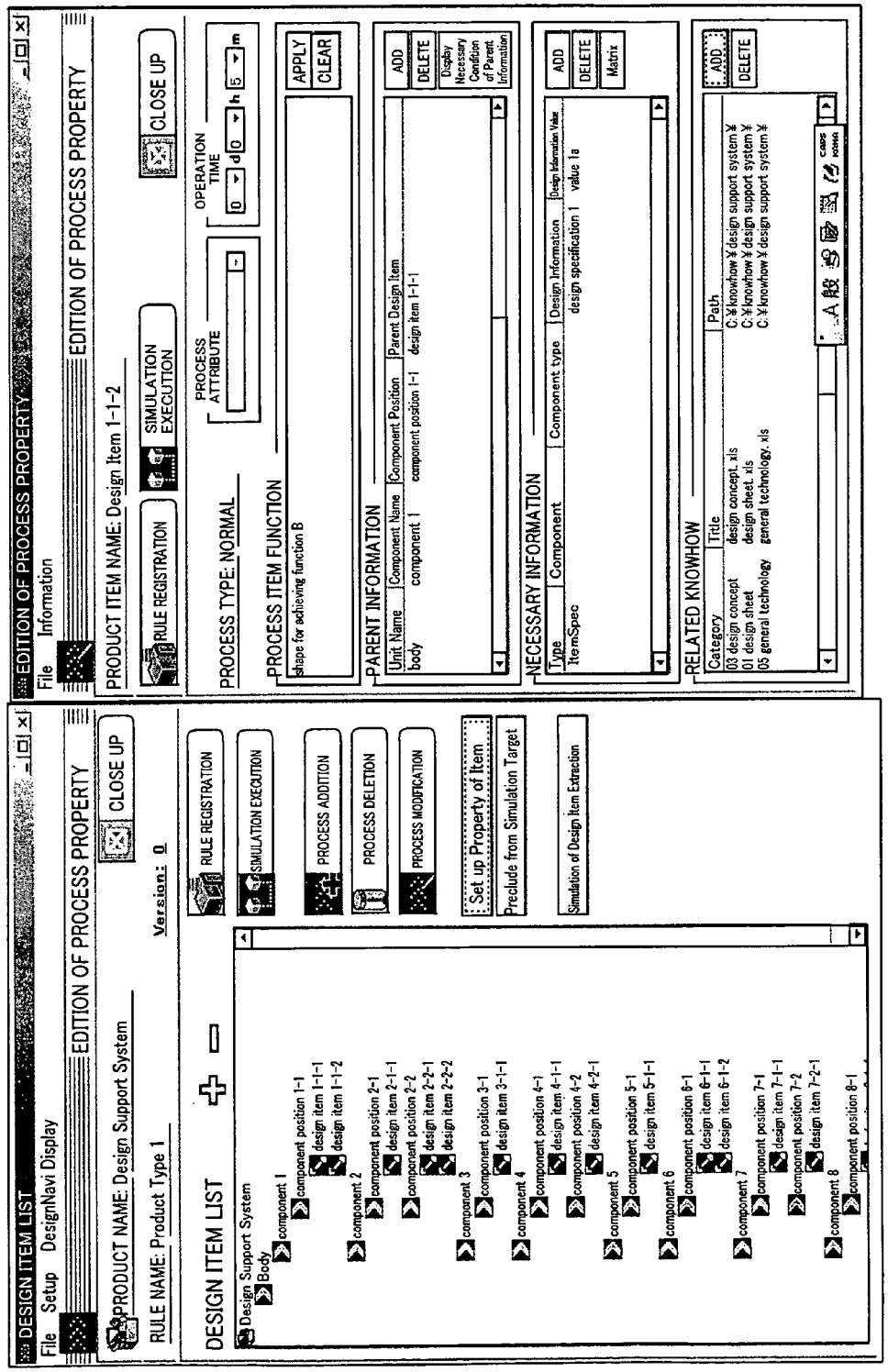
FIG. 6 is a diagram showing a dialog box for registering a design item itself (left side of the figure), and entering, editing and registering properties of a specific design item, which is to be displayed in response to clicking on a "Design Item Registration" button in the dialog box in FIG. 3.

The "design item registration" will be described below When the operator clicks on the "Design Item Registration" button of the dialog box in FIG. 3, a window as shown in FIG. 6 is displayed (S204). This window is a dialog box for registering a design item itself (on the left side of FIG. 6), and entering, editing and registering properties of a specific design item, for example "design item 1-1-2" (on the right side of FIG. 6).

The example in FIG. 6 shows a dialog box in a stage where a certain number of design items have already been registered. In a stage where the setup mode is initially started up, only a lower level just next to "Body" in a tree structure on the left field, or "component 1" and the like, has been registered, but further lower levels, or "component position 1-1", "design item 1-1-1" and the like, have not been registered. In this case, the operator can register the "component position" and "design item" one by one according to a given procedure.

The left dialog box represented as a tree structure in FIG. 6 is configured such that a design item, any "component position" required for designing the design item, and any component associated with the design item can be registered therethrough. However, this association function is just intended to allow information about what kind of components and component positions is associated with a design item to be presented to an operator in a clearly understandable form, and the components such as "component 1" to be registered through this dialog box have no relation to the operation for setting up the correlation with the design items and design specifications which is executed in another job in this embodiment.

When a new item is registered through the left dialog box represented as a tree structure in FIG. 6, the registered item is displayed at a given position in this tree. While an operator can freely determine the depth of the tree hierarchy in consideration of operationality of the setup mode, the system according to this embodiment is managed under a rule that the lowest level must be a design item. If it is necessary to register a registered item as a design item, an operator will specify this intention separately. For example, if a "design item 1-1-2" is newly registered at the lowest level of the tree and then specified as a design item, an operator will enter informations about the design item through fields for entering and editing properties, which are provided in the right dialog box illustrated in FIG. 6.

Preferably, design items to be listed on the left dialog box represented as a tree structure in FIG. 6 cyclopaedically include not only design items required for designing specific one version of a certain product but also design items for all products belonging to the same category as that of the product version. This makes it possible to navigate design engineers on the subject of all products belonging to the above category by use of this system. For example, while the number of design items required for designing one version belonging to a product category of portable phones is about 300, the total number of design items required for designing all versions of portable phones subject to this system can go up to several thousands. In this case, all design items of a certain product are listed on the tree on the left side of FIG. 6. That is, design items required for designing specific one version of the product are included in the tree as only a part of the design items listed thereon.

The right dialog box or property input/edition dialog box in FIG. 6 includes a field titled "Design Item Name" indicating that this dialog box relates to a "design item 1-1-2", on the top thereof. On the underside of the "Design Item Name" field, the property input/edition dialog box also includes four fields titled "Design Item Function", "Parent Information", "Necessary Condition" and "Related Knowhow".

The "Design Item Function" is a field for entering a description on the function of a design item related to this dialog box (hereinafter referred to as "target design item"). It is desired to enter the description in a form such that any person who performs the detailed design in a subsequent stage can instantly understand the outline of the target design item.

Figure 7:
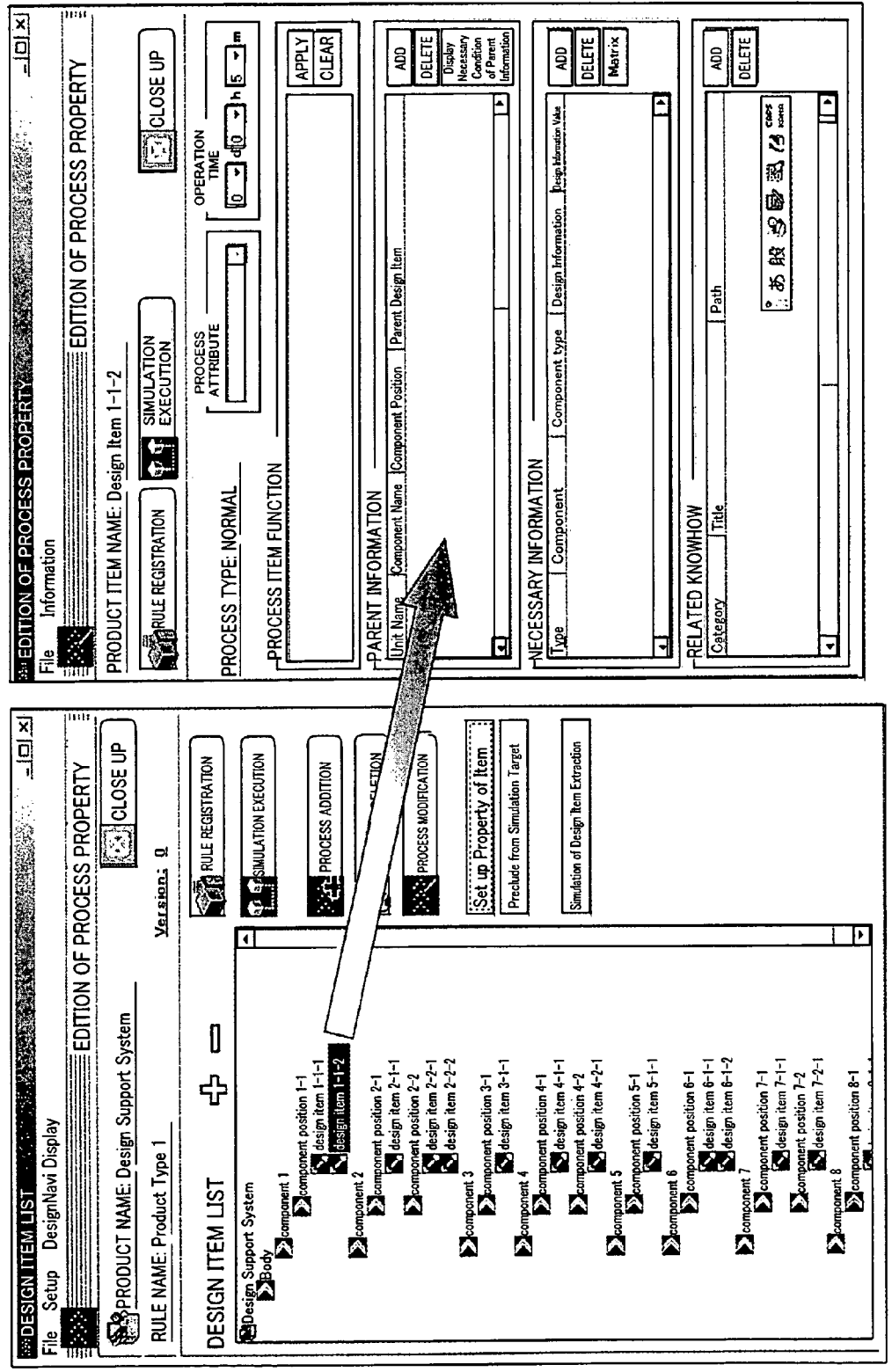
FIG. 7 is a diagram showing a process of defining a parent item.

The "Parent Information" is a field for defining a design item which must have been completed to enable a job on another design item to be executed (such a design item is referred to as "parent item" herein). This information must be entered to create a design flow diagram representing the procedure of the design items (S207). As shown in FIG. 7, an operation of defining a parent item can be completed just by dragging and dropping a design item corresponding to the parent item ("design item 1-1-1" in this example) from the left tree to the "Parent Information" field. Through this operation, the "design item 1-1-1" is displayed on the "parent information" field, and defined as a parent item of the "design item 1-1-2".

The number of design items to be designated as a parent item is not always one because there is a possibility that a job on a certain design item can be initiated only after the completion of a plurality of other design items. In this case, it is required to register a plurality of design items corresponding to parent items in the "Parent Information" field.

After the parent information is fully set up for each of the design items, the operator can click on a "Simulation Execution" button in FIG. 6 to automatically check whether the registered content includes logical inconsistency. This operation is performed by executing a simulation program pre-installed in the computer. While the system according to this embodiment is configured to register the information about the parent item or one or more of the design items which must have been completed to enable one or more of the target design item to be executed, it may be configured to register information about one or more of the design items which can be newly executed only after the completion of the target design item (such a design item is referred to as "children item" herein).

The "Necessary Condition" is a field for defining the correlation between the target design item and the aforementioned design specification or component, and must be entered (S206). Information to be set up in the "Necessary Condition" field of the right dialog box in FIG. 6 is used to define a condition for extracting a design item required for designing one specific version from the entire design items.

When the operator clicks on an "Addition" button on the right side of the "Necessary Condition" field, a dialog box as shown in FIG. 8 is displayed. This dialog box is configured to display all of the design specifications and components which have already been registered through the dialog boxes in FIGS. 4 and 5. If the operator selects one desired component from a field titled "Component List" on the left side of the dialog box in FIG. 8, and clicks on a checkbox at the head of the row of the selected component, a check mark will be displayed on the checkbox. This check mark indicates that the correlation between the target design item and the selected component has been set up. In the same way, if the operator selects one desired design information name (i.e. design specification) from a field titled "Design Information List"-on the right side of FIG. 8, and clicks on a checkbox on the head of the row of the selected design specification, a check mark will be displayed on the checkbox. This check mark indicates that the correlation between the target design item and the selected design specification has been set up.

As above, it has been described that the target design item is correlated with the "design specification or component". This reason will be described below in more detail. It could be generally considered that an intended purpose is achieved by correlating a design item only with only either one of a design specification and a component, because the design specification and the component have already been correlated with each other. However, considering on the basis of a design specification, there are two cases: one case where it is directly connected to the need for a design item, and the other case where it is indirectly connected to the need for a design item. The "direct" causal connection means a case where "a design specification X is satisfied by achieving a design item a". For example, in order to satisfy one design specification intended to "positively increase strength of a product", it is required to set up a design item capable of achieving the required performance of the product, such as "selection of a metal-based material instead of a resin material" or "formation of a reinforcement rib". Otherwise, in order to satisfy another design specification intended to "form a design surface as an embossed surface", it is required to set up a design item such as "designation of an embossing finish". The needs of these design items arise irrespective of the presence of components.

The "indirect" causal connection means a case where "if one component B is used, the need for a certain design item will arise in another component B". For example, given that the components A are B are respectively a rear case of a portable phone, and a vibration motor, the need for a design item of "forming a rib in the rear case (to fix the vibration motor)" is caused by using the vibration motor as a component which is required to satisfy a design specification intended to "allow an incoming call to be recognized using other means than audio". Thus, while an intended purpose can be achieved by connecting a design item directly to a design specification, because the design specification and the component have already been correlated with each other, as described above, this approach applied to the above case results in correlating the design specification intended to "enable an incoming call to be recognized using other means than audio", which serves as a necessary condition, with the design item of "forming a rib in the rear case". This indirect relationship between the design specification and the design item will make it difficult for an operator to set up a necessary condition with a visceral understanding.

From this point of view, instead of limiting the condition (necessary condition) for extracting a design item to only either one of a design specification and a component, the system according to this embodiment is configured such that any one of a design specification and a component can be selectively used to define the correlation with a design item so as to facilitate visceral understanding. The system is also configured such that enumerated extraction conditions can be formulated using any logical operator, such as "AND" or "OR" to further facilitate defining the condition for extracting a design item with a visceral understanding.

In the example illustrated in FIG. 6, the "design specification 1" and "value 1a" are entered in the "Necessary Condition" field. A character "Item Spec" displayed on a field titled "Type" indicates that a design specification as a necessary condition is correlated with the target design item. In other words, the "Item Spec" indicates that the design specification defined by the "design specification 1" and "value 1a" is correlated with the "design item 1-1-2". A design specification or component correlated with a design item in this manner will be used as information for extracting the design item according to the design specification or component in the execution mode. If a component serving as a necessary condition is correlated with a design item, a character "Part Type" will be displayed on the "Type" field.

Figure 9:
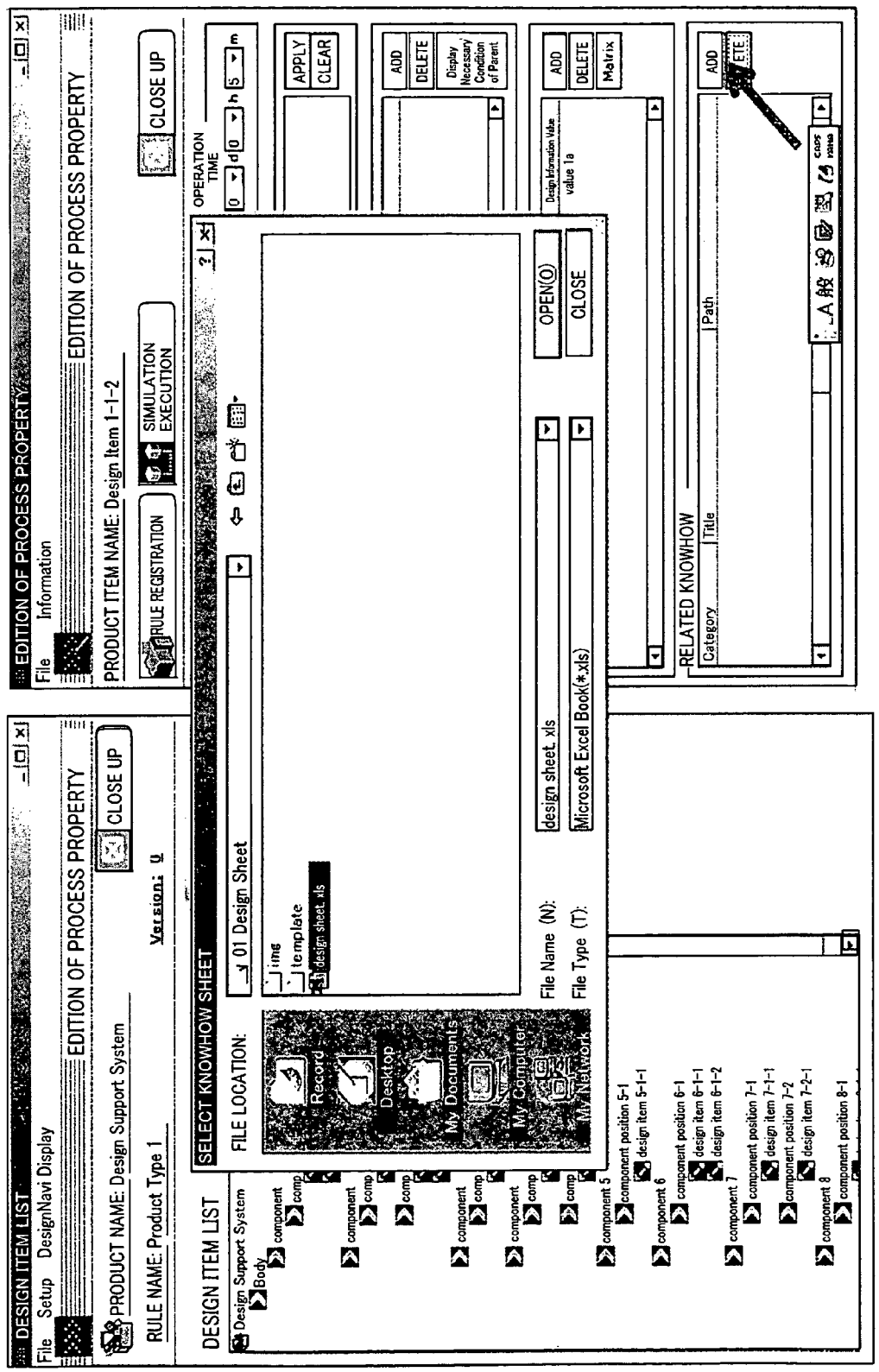
FIG. 9 is a diagram showing a process of registering related knowhow.

FIG. 9 is an explanatory diagram of a process for registering a related knowhow (S208). Various knowhows related to design jobs are pre-stored in a database in the form of a number of documents. These documents are prepared by performing inquiry/interview with skilled engineers or accumulated through actual design jobs using this system. This process will be described in conjunction with an operation for necessary ones of the stored documents are correlated with corresponding design items.

When the operator clicks on an "Addition" button on the "Related Knowhow" field in FIG. 6, a dialog box for listing up files in a folder storing documents capable being registered as knowhow is displayed as shown in FIG. 9. These files are documents stored in a conventional file format such as Excel or Word (registered trademarks of Microsoft Co., Ltd.). The contents of these documents include patent information about the target design item, information about concerns or defects of the product, advisory/cautionary information about design jobs, and so-called knowhow.

Figure 10:
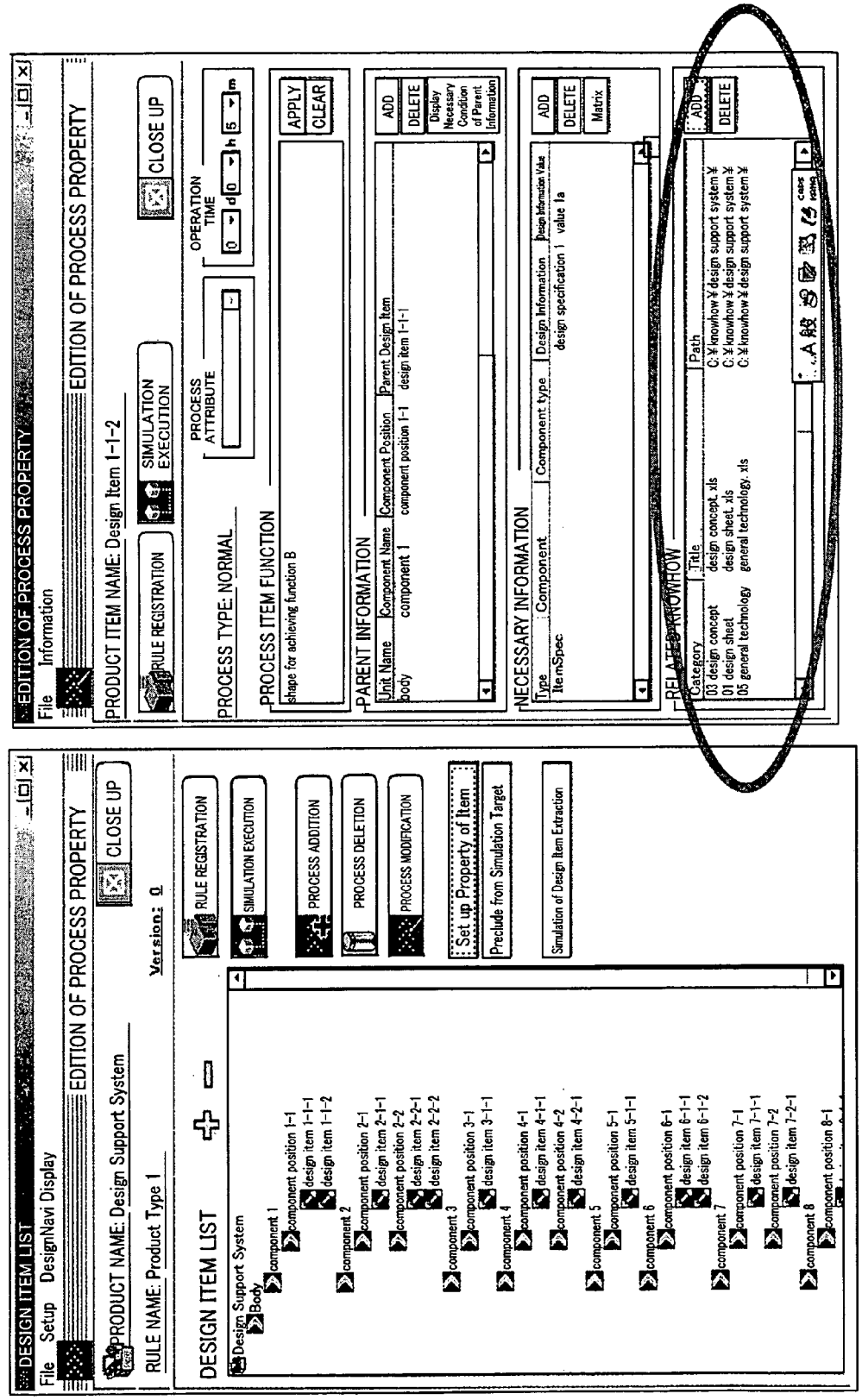
FIG. 10 is a diagram showing a process of registering related knowhow in conjunction with FIG. 9.

In response to clicking on an "Open" button after selecting appropriate one of the documents in FIG. 9, the selected document is registered in the "Related Knowhow" field, as shown in FIG. 10. If the operator decides that the registered document is unnecessary, the document can also be readily deleted. In this operation, data actually registered in the "Related Knowhow" field is a path to the document displayed thereon. Specifically, in response to clicking on either one of the document displayed on the "Related Knowhow" field in the detailed design as described in detail later, an application associated with the document is automatically activated. Then, a file of the document is read in the application, and displayed.

After informations about the "design item 1-1-2" are fully entered in the property input/edition dialog box on the right side of FIG. 6, a "Close" button on the upper right side of FIG. 6 can be clicked to store the entered properties as the properties of the "design item 1-1-2".

As described above, design items and other items than the design items can be bilaterally altered. For example, when the operator selects the "design item 1-1-1" displayed on the left side of FIG. 6 with the mouse, a "Shift to Simulation Target" button (not shown) is displayed on the right side of the tree. Then, the operator can clicks on this button to register the "design item 1-1-1" as a design item. The term "registering as a design item" can also be expressed that the design item becomes one element constituting an aftermentioned design flow diagram. Otherwise, when the operator selects one item which has already been registered as a design item, a "Preclude from Simulation Target" button will be displayed. Then, if the operator clicks on this button, the selected item will be precluded from a design item. The operator will appropriately perform the above operation to add, alter and delete items and to register items as design items.

As described above, all of the items at the lowest level, such as the "design item 1-1-1", are registered as a design item, and a rectangular mark (hereinafter referred to as "link mark") displayed on the head of each of the design item names graphically indicates that the item has been registered as a design item. Differently from the items at the lowest level, any of the items at the upper levels are not registered as a design item, and a different rectangular mark (hereinafter referred to as "rightward arrow mark") displayed on the head of each of these items graphically indicates that the item has not been registered as a design item.

The item with the link mark is a design item or a simulation target. In the state after the item with the link mark is selected, the "Prelude from Simulation Target" button is displayed. If the operator clicks this button, the item will be precluded from a simulation target (design item), and the mark displayed on the head thereof will be changed to the rightward arrow mark. In this case, the information about the properties of this item entered through the dialog box on the right side of FIG. 6 will be maintained without deletion, and can be used in future. Otherwise, in the state after the item with the rightward arrow mark is selected, the "Shift to Simulation Target" button (not shown) is displayed. If the operator clicks this button, the item will becomes a design item, and the mark displayed on the head thereof will be changed to the link mark.

Figure 11:
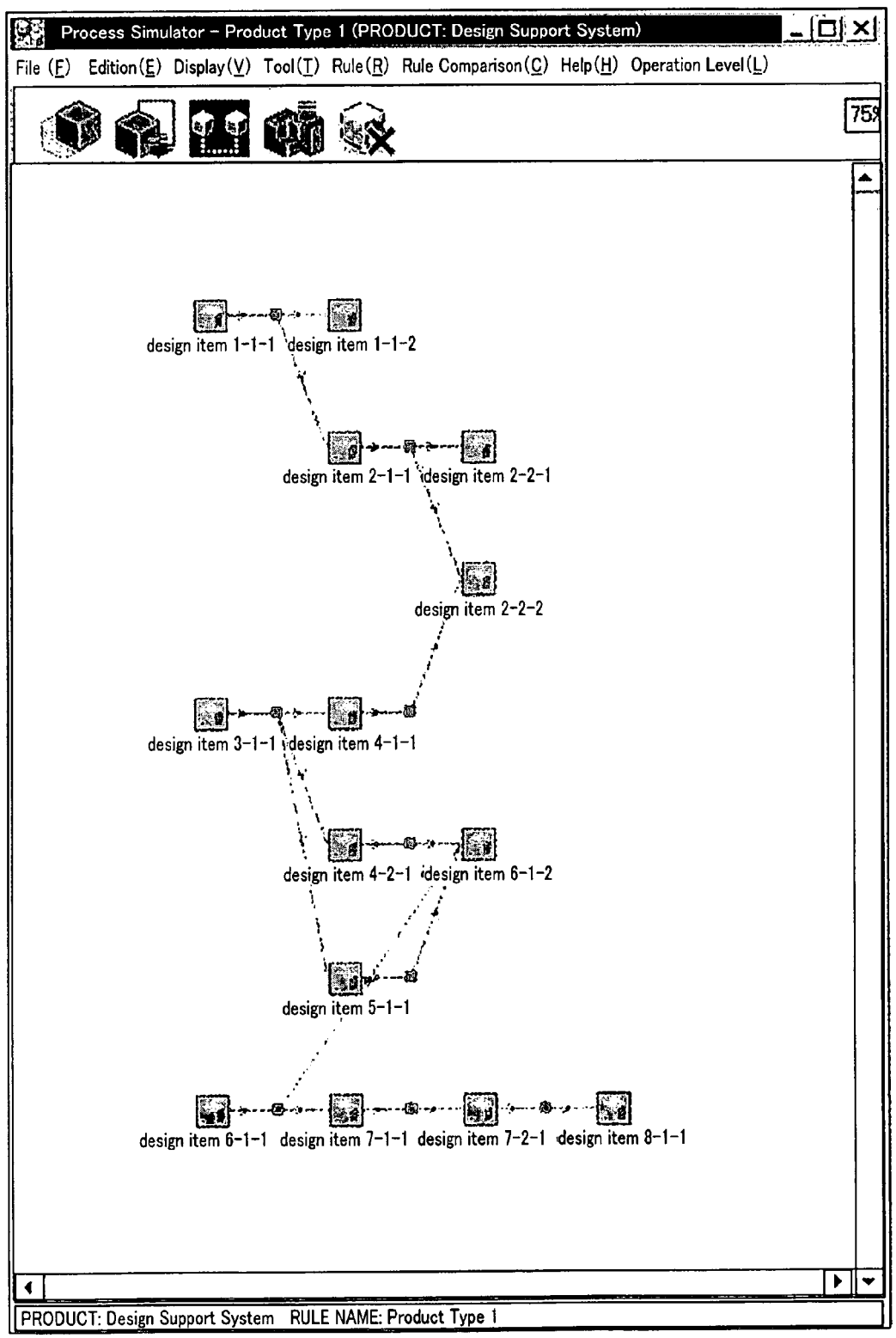
FIG. 11 is a diagram showing a created design flow.

In response to clicking on a "Design Item Extraction Simulation" button on the left dialog box in FIG. 6, the system extracts simulation targets or design items from the entire items, and refers to the aforementioned "parent information" about each of the extracted design items to create a design flow diagram as shown in FIG. 11 (S209). This design flow diagram is a prototype but not a finished or final design flow diagram. The operator executing the setup mode checks whether the design flow diagram includes inconsistency. If any logical inconsistency is found, the parent information about a design item related to the inconsistency will be corrected (S207).

When the correlation between a design specification and a component is set up (S205), and then the correlation between a design item and the design specification or component is set up (S206), the system internally checks whether these correlations include logical inconsistency (S210). If any inconsistency is found, the operator executing the setup mode will review the informations concerning the correlations to solve the inconsistency.

The "setup mode" has been described in detail. The operations in the setup mode can be summarized as follows. In case where one R & D section is intended to develop a new product, for example a portable phone, and design each version of the product under the support of this system, inquiries/interviews are first carried out for engineers knowledgeable about the design of portable phones to acquire informations about what kind of design items, design specifications and components is required. Then, through the windows in FIGS. 4, 5 and 6, the acquired design specifications, components and design items are registered, and the correlations between each of the design specifications and each of the components and between each of the design items and each of the components or design specifications are set up. Further, parent informations and knowhow documents about the design items are registered.

In this manner, requited informations about the design specifications, components and design items are sufficiently registered through the setup mode. These informations make it possible to navigate design engineers who actually design specific product versions belonging to the same category, through the "concept design" and "detailed design" of the following execution mode.

[Execution Mode]

Figure 12:
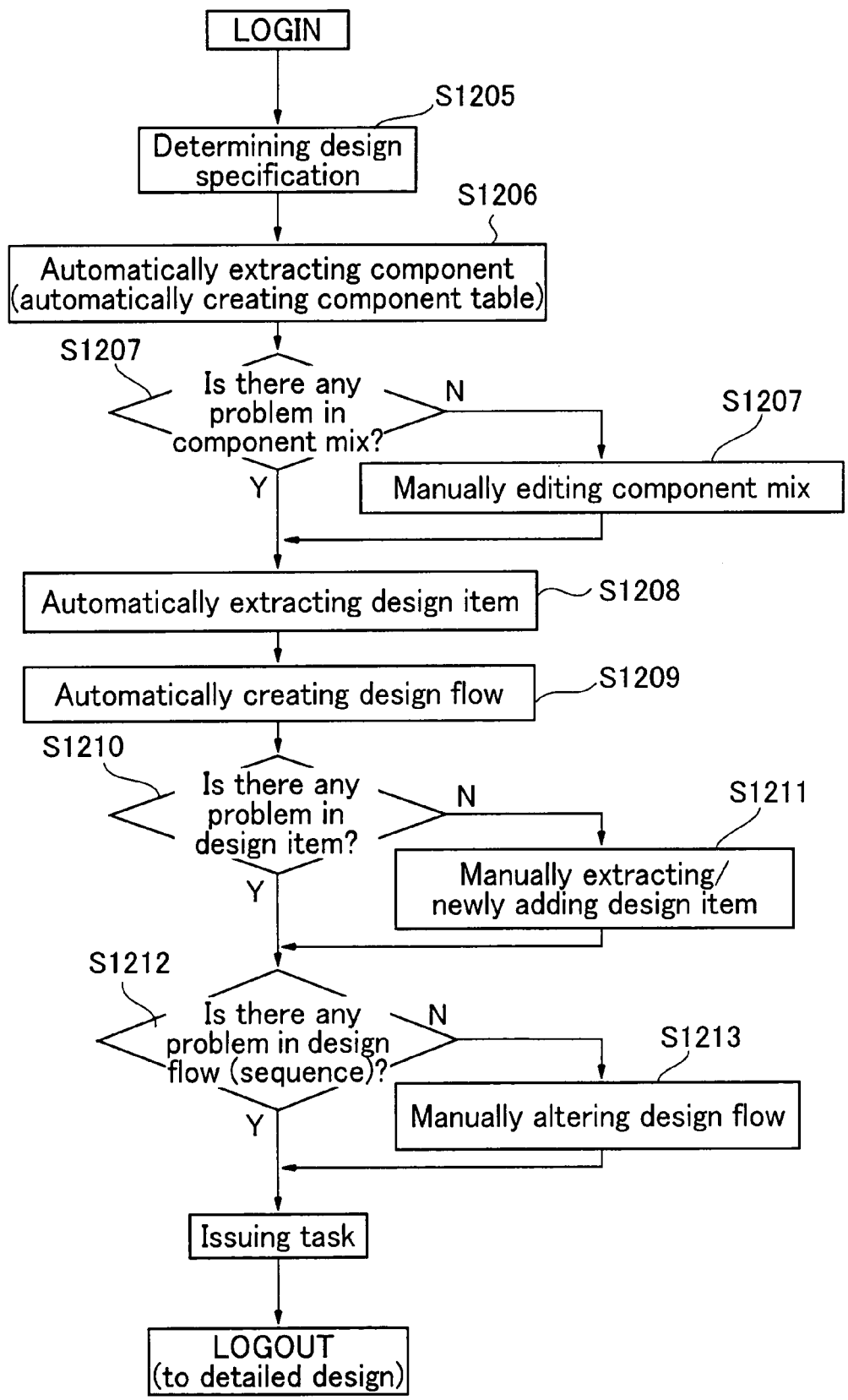
FIG. 12 is a schematic flowchart showing a procedure in a concept design.
Figure 13:
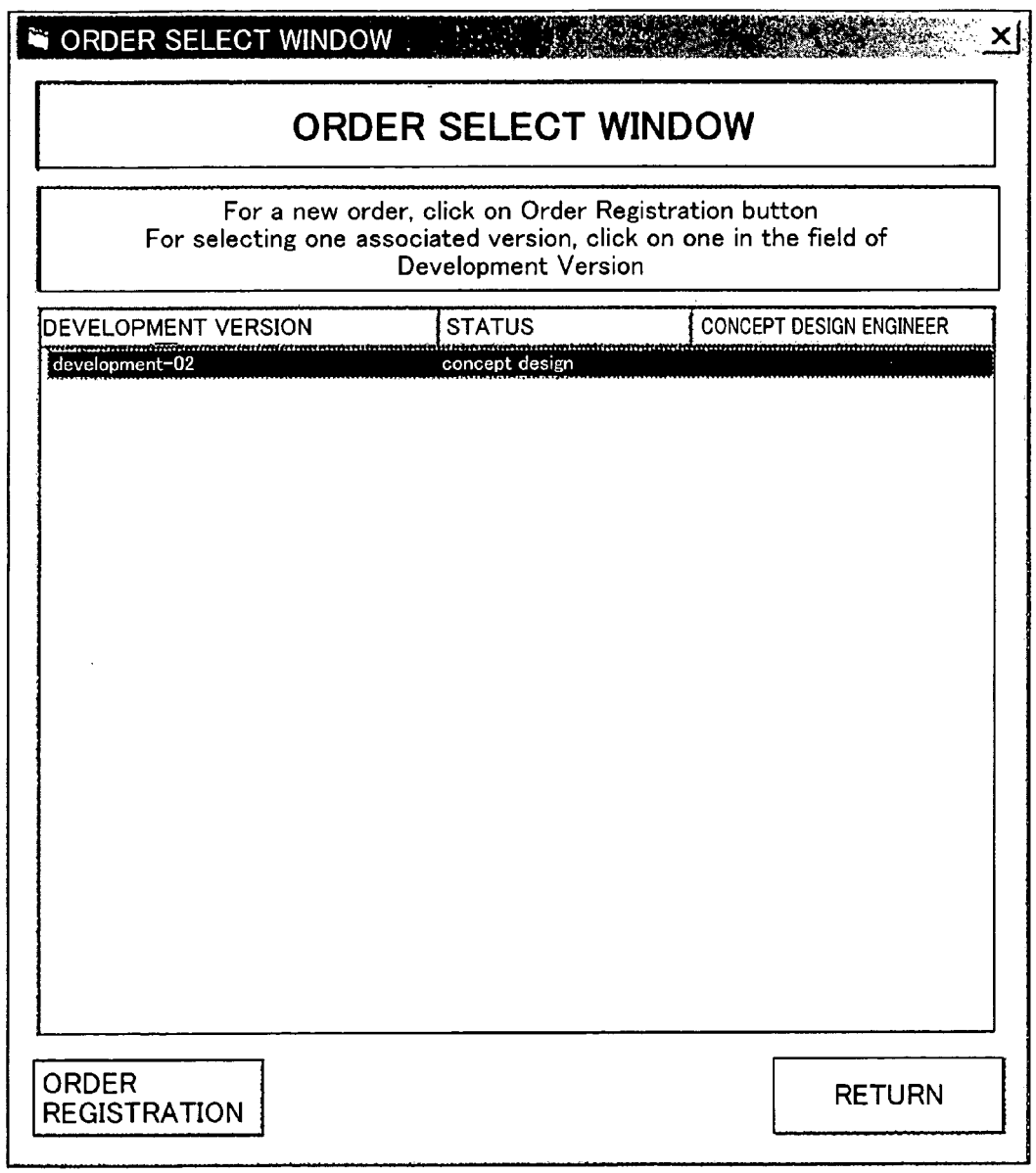
FIG. 13 is a diagram showing a dialog box to be displayed in response to clicking on the "Concept Design" button in the dialog box in FIG. 1.

The concept design as one of the sub-modes of the execution mode will be described below. FIG. 12 is a schematic flowchart of the procedure of the concept design. When an operator or concept design engineer clicks on the "Concept Design" button of the window in FIG. 1, a dialog box as shown in FIG. 13 is displayed. On this dialog box, a certain number of orders have already been displayed in the form of list, and the concept design engineer can simply select associated one of the orders (version). In the example of FIG. 13, only one order titled "development-0" is displayed. If no order associated with the concept design engineer is registered, the concept design engineer can register a new order by him/herself.

When the concept design engineer clicks on the order "development-0" on the dialog box in FIG. 13, a dialog box "Concept Design Information Input Window" as shown in FIG. 14 is displayed. This window is used in a job for determining design specifications (S1205). Generally, design specifications are determined through studies on functions or performances required for the product to be developed, in consideration of opinions of a client requesting the design. Using the dialog box in FIG. 14, the contents or design values of each of design specifications required for designing the portable phone ("design specification 1", "design specification 2". "design specification 3", displayed on a field titled "Design information Item" in the form of list in the middle of the dialog box) are entered in such a manner that they are written in blank fields titled "Design Value".

In order to facilitate the input operation on design specifications and give inexperienced engineers a hint on designing, the dialog box is configured such that design values of a previously developed similar version if any can be diverted. In case of diverting a part of design values of a previously designed version, the concept design engineer can click on a downward arrow on the right side of an input box titled "Referential Version Name" to select one of registered versions. FIG. 15 shows the state after a "version-0" as one of the registered versions is selected, and the design value of the "version-0" is displayed on a field titled "Reference Value".

While input values are displayed in the form of "value 1a" or the like on the "Reference Value" and "Design Value" fields in FIG. 15, specific numerical values are actually entered and displayed. For example, if the design specification is the dimension of a window to be formed in a liquid-crystal display board, the dimension will be entered and displayed in a given length unit. If the specification is a height as an acceptance value in a drop test, a height value, e.g. 5 m, will be entered and displayed. The concept design engineer can determine design specifications for the "development-0" with reference to the design values of the design specifications of the "version-0. For example, in case where if it is allowed to use the same design specifications in different versions at high rates, as in the design of portable phones, many previously created design specifications can be diverted to facilitate reduction in necessary operation time as compared to a conventional process of creating design specification from nothing.

Figure 16:
FIG. 16 is a diagram showing the state after all design specifications are entered in the dialog box in FIG. 15.

As mentioned in connection the setup mode, when a certain design specification is determined, a required component can be automatically extracted from the component list pre-registered in the database according to the design specification, because the correlation between the design specification and the component has been defined and registered in the database (S1206). FIG. 16 shows the state after design specifications are fully entered through the dialog box in FIG. 15. In this state, a "Component Registration" button on the lower left side of the dialog box in FIG. 16 can be clicked to display a window of a component table as shown in FIG. 17 on the display screen.

Figure 17:
FIG. 17 is a diagram showing a window of a component table to be displayed in response to clicking on a "Component Registration" button in the dialog box in FIG. 16.

As shown in FIG. 17, informations about one component are displayed on a single row. The informations specifying each of the components are displayed on fields titled "Unit Name", "Sub-Unit Name", "Component Name", "Component Type Name", "Component Number", "Cost", "Material" and "Weight". However, information is not always displayed in all of these fields. Further, while all components displayed on the "Unit Name" field in the dialog box illustrated in FIG. 17 have the same unit name "body", it is no more than coincidental. The concept design engineer adds, deletes and alters components based on the displayed components in conformity to a product version intended to design this time to determine components required for the version, and registers the determined components through the dialog box in FIG. 17.

Figure 18:
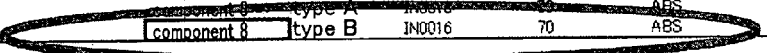
FIG. 18 is a diagram showing a window to be displayed in response to clicking on a "Component Overall List" button in the dialog box in FIG. 17, wherein all components registered in the system are displayed thereon.

The system according to this embodiment has a function of displaying all of the components registered in the setup mode so as to facilitate the addition, alteration and deletion of components. In response to clicking on a "Component Overall List" on the dialog box in FIG. 17, all of the components are registered in this system as shown in FIG. 18. While not clearly shown in FIG. 18, only the components selected for the version "development-02" to be designed this time are displayed with a specific color different from that of the remaining displayed components. Thus, upon displaying the "Component Overall List" in FIG. 18, the components selected through the component table in FIG. 17 can be instantly distinguished from others. If it is necessary to newly add an unselected component, the concept design engineer can clicks on a "Registration" button in FIG. 18 to add the component to the component table in FIG. 17.

In reverse to this operation, if the concept design engineer determines that the components automatically selected by the system in accordance with the informations set up in the setup mode includes unnecessary one for the version, he/she can select a row including the unnecessary component and click on a "Delete" button to delete the component from the component table in FIG. 17. When the component overall list in FIG. 18 is subsequently displayed, the row which has included the deleted component is displayed with a color for the non-selected components.

Upon completion of the above determination of the design specifications and the components, the system goes into the state allowing any design item required for designing this version to be extracted in accordance with the informations set up in the setup mode (S1208). Thus, when the concept design engineer clicks on a "Flow Creation" button in FIG. 17, the system can internally extract design items for this version, and supply the extracted design items and the aforementioned parent information for each of the extracted design items to an algorism for creating a flow diagram so as to create a design flow diagram (S1209).

Figure 19:
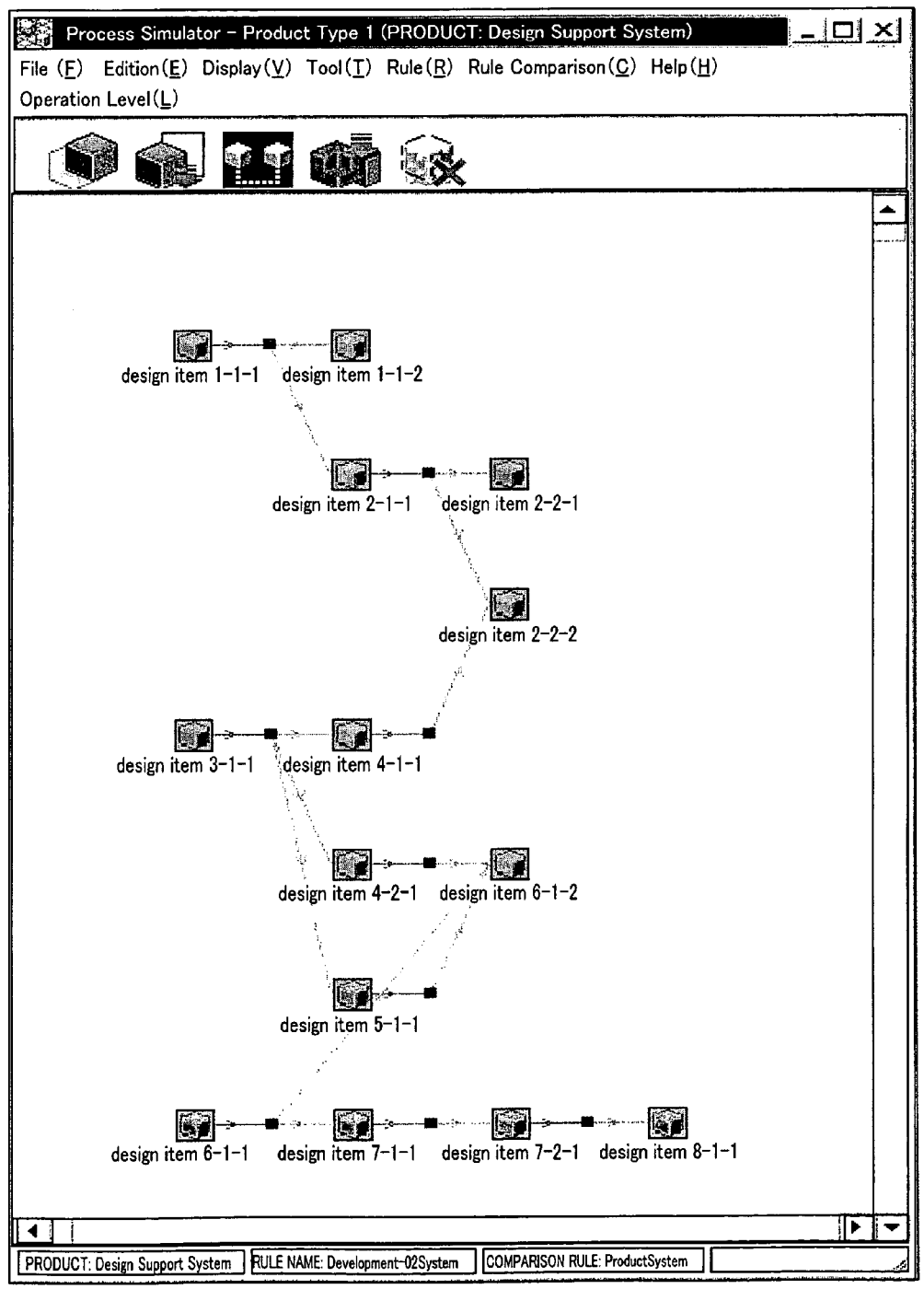
FIG. 19 is a diagram showing one example of a created design flow.

FIG. 19 shows one example of a design flow diagram created in this way. In this design flow diagram, each of square marks each with a note, such as "design item 1-1-1", displayed on the underside thereof indicates one of the design items. The horizontal axis represents the lapse of an operation time (in the rightward direction). That is, when comparing any two of the design items (e.g. "design item 1-1-1) and "design item 2-1-1"), one ("design item 2-1-1") located at a position more rightward than that of the other must be temporally executed later. Further, the design items located at the same position on the horizontal axis may be concurrently executed. For example, in FIG. 19, any one of the "design item 1-1-1, the "design item 3-1-1") and the "design item 6-1-1" may be initiated earlier than others. Otherwise, a plurality of design engineers sharing jobs can concurrently execute them.

The following facts can be seen in FIG. 19. Firstly, the completion of the design item 1-1-1 allows the design item 1-1-2 and the design item 2-1-1 to be initiated, and the completion of the design item 3-1-1 allows the design item 4-1-2, the design item 4-2-1 and the design item 5-1-1 to be initiated. While the design item 2-2-1 can be executed if only the design item 2-1-1 is completed, the design item 2-2-2 can be executed only after both the design item 2-1-1 and the design item 4-1-1 are completed. Further, the design item 6-1-2 can be executed only after the three design items 4-2-1, 5-1-1 and 6-1-1 are completed. Thus, the above graphical representation of the relationship of the design items allows an operator to visually figure out the progress of the entire design jobs and the presently initiatable design items.

Based on the created design flow diagram, the concept design engineer checks whether the design items themselves involve a problem (S1210). If there is any problem, the concept design engineer will correct the related design item (S1211). When there is no problem, the concept design engineer checks whether the design flow involves a problem (S1212). If there is any problem, the concept design engineer will manually correct the design flow diagram (S1213).

One of the futures of this system is in that in the process of creating the design flow chart in FIG. 19, only the informations about the respective parent design items of the extracted design items can be defined to create an adequate design flow, as described above.

Figure 20:
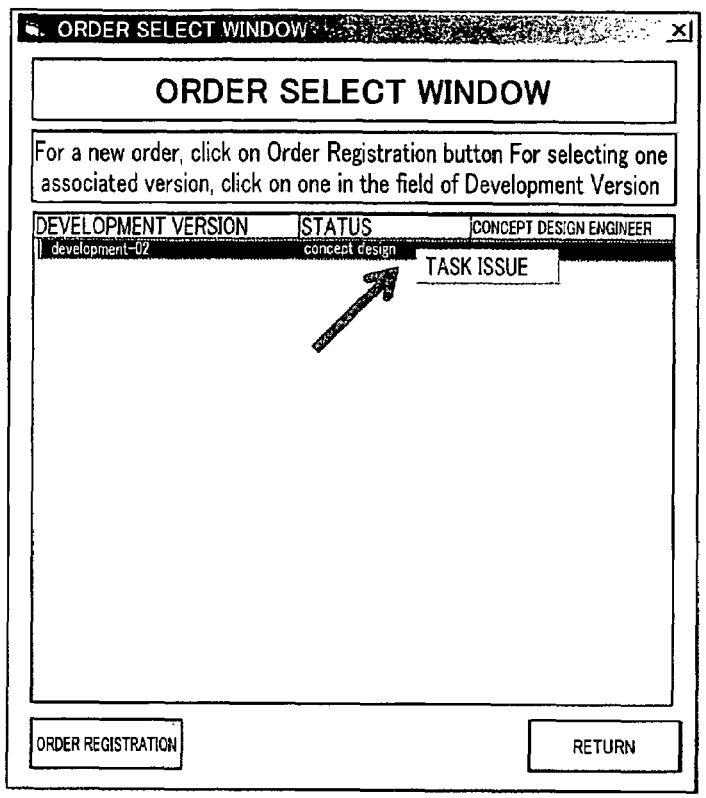
FIG. 20 is an explanatory diagram of a "task issue" operation for informing the system of the completion of the concept design.
Figure 21:
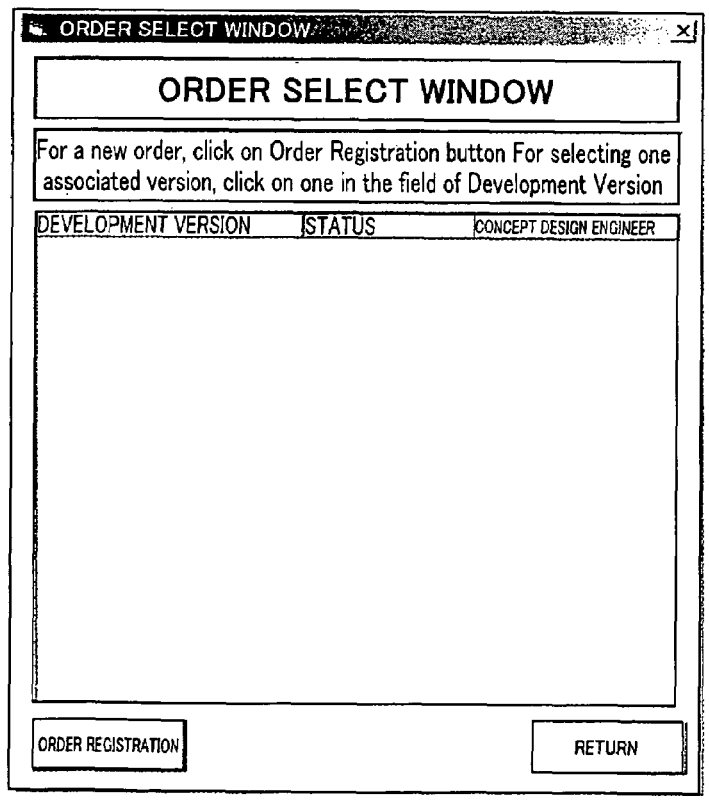
FIG. 21 is an explanatory diagram of an operation for shifting a task from concept design to a detailed design.

An operation for informing the system of the completion of the concept design is performed using a "Task Issue" button as shown in FIG. 20. This dialog box is identical to that in FIG. 13. Specifically, when the concept design engineer places a pointer on a row of the "development-02", and clicks it with the right mouth button, the "Task Issue" button is displayed. When the concept design engineer can click on this button, the design task on the "development-02" is shifted from the concept design to the detailed design, and the display concerning the task disappears from the "Order Select Window" as shown in FIG. 21.

[Detailed Design]

The detailed design as the other sub-mode of the execution mode will be described below. In this detail design, the system is operable to navigate jobs of an operator actually executes the design items, for example, on a terminal of a CAD system different from this system.

Figure 22:
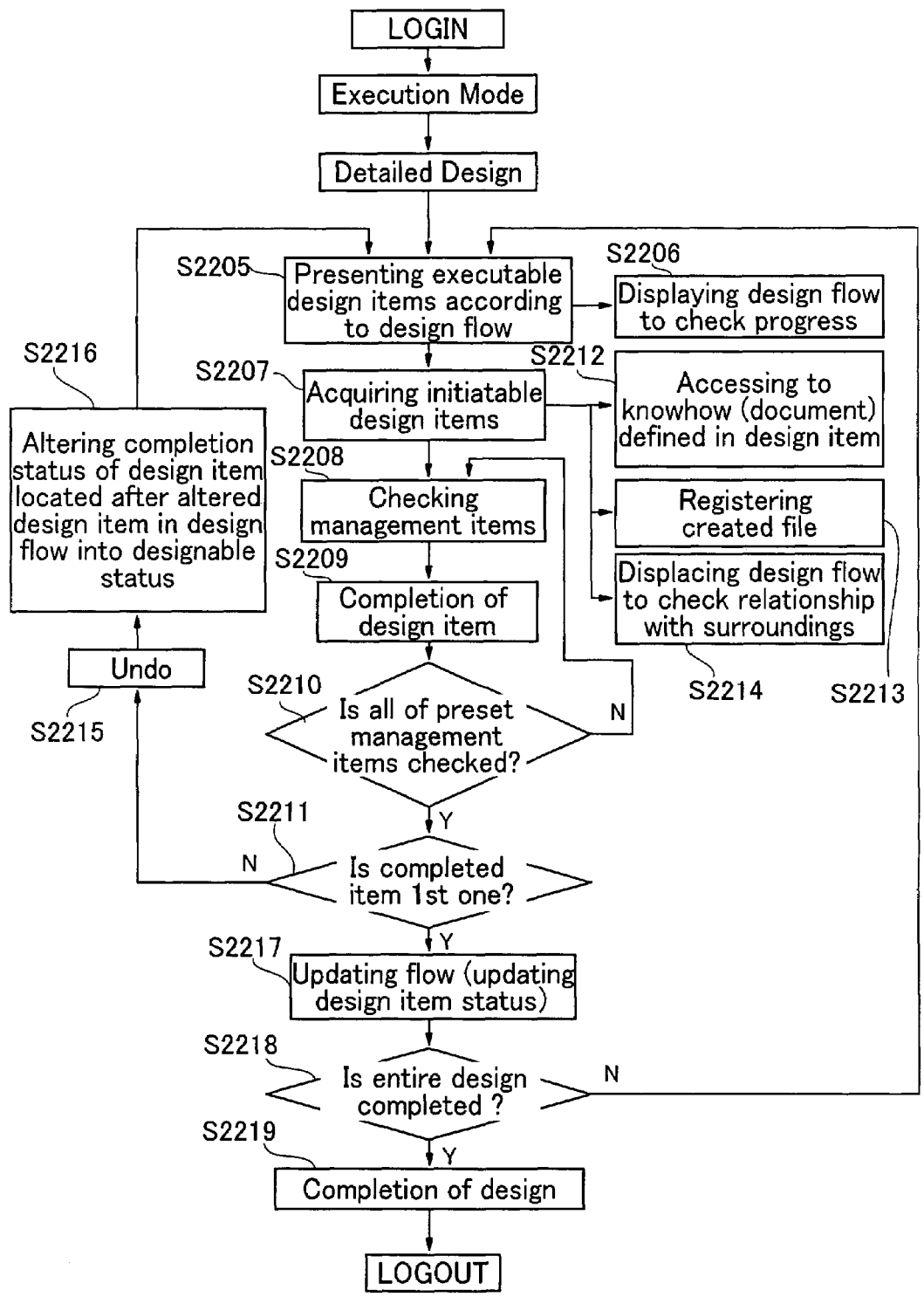
FIG. 22 is a schematic flowchart showing the detailed design.
Figure 23:
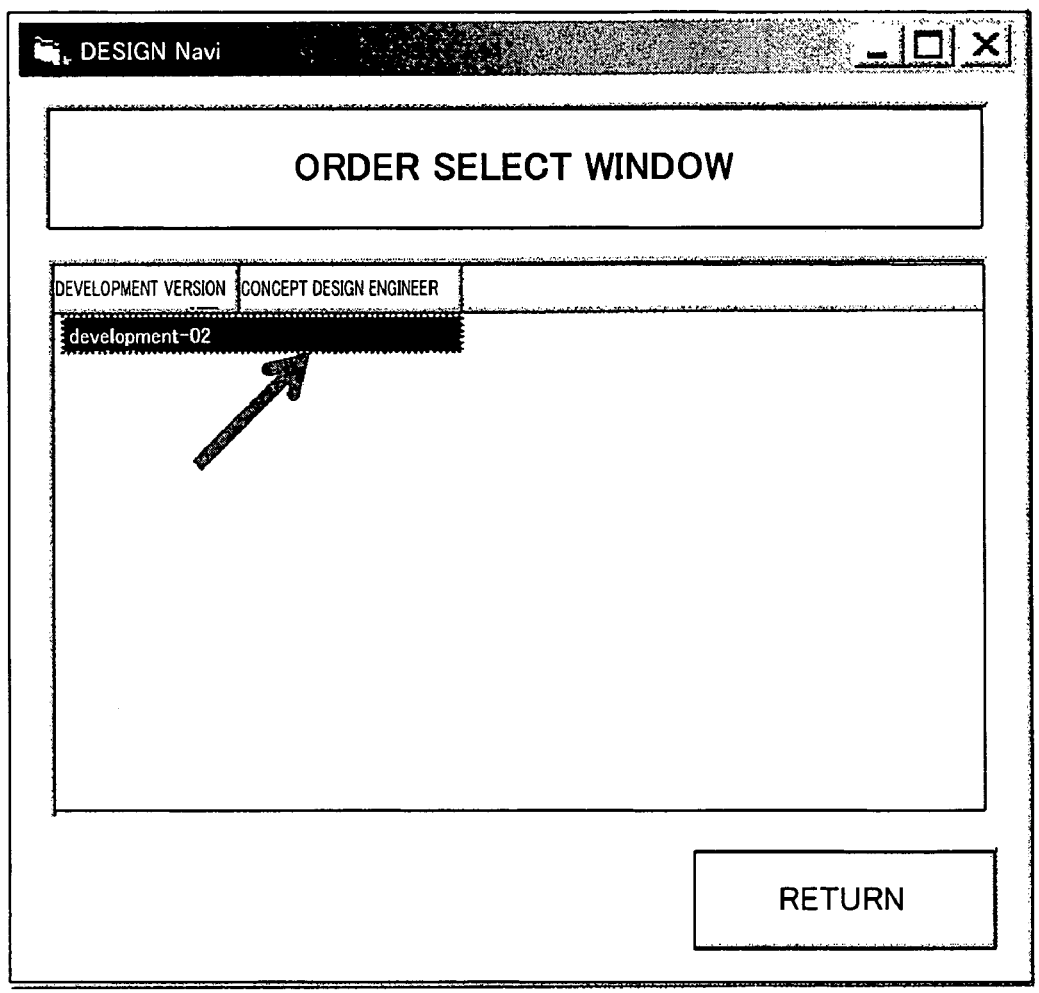
FIG. 23 is a diagram showing a window to be displayed in response to clicking on the "Detailed Design" button in the dialog box in FIG. 1.

FIG. 22 is a schematic flowchart showing the entire process of the detailed design. In the procedure of the detailed design, a process of entering a user name and a password and clicking of an "OK" button on a login window (not shown) to display the dialog box in FIG. 1 is the same as that in the "setup mode" and the "concept design". In response to clicking on the "Detailed design" button on the dialog box in FIG. 1, a dialog box as shown in FIG. 23 is displayed. This dialog box acts to perform "order selection", and corresponds to the dialog box in FIG. 13.

The task "development-02" exists on the dialog box in FIG. 23. This results from operating the dialog box in FIG. 20 to generate the task issue for the detailed design using so as to shift the task from the concept design to the detailed design, as described in connection with the concept design.

Figure 24:
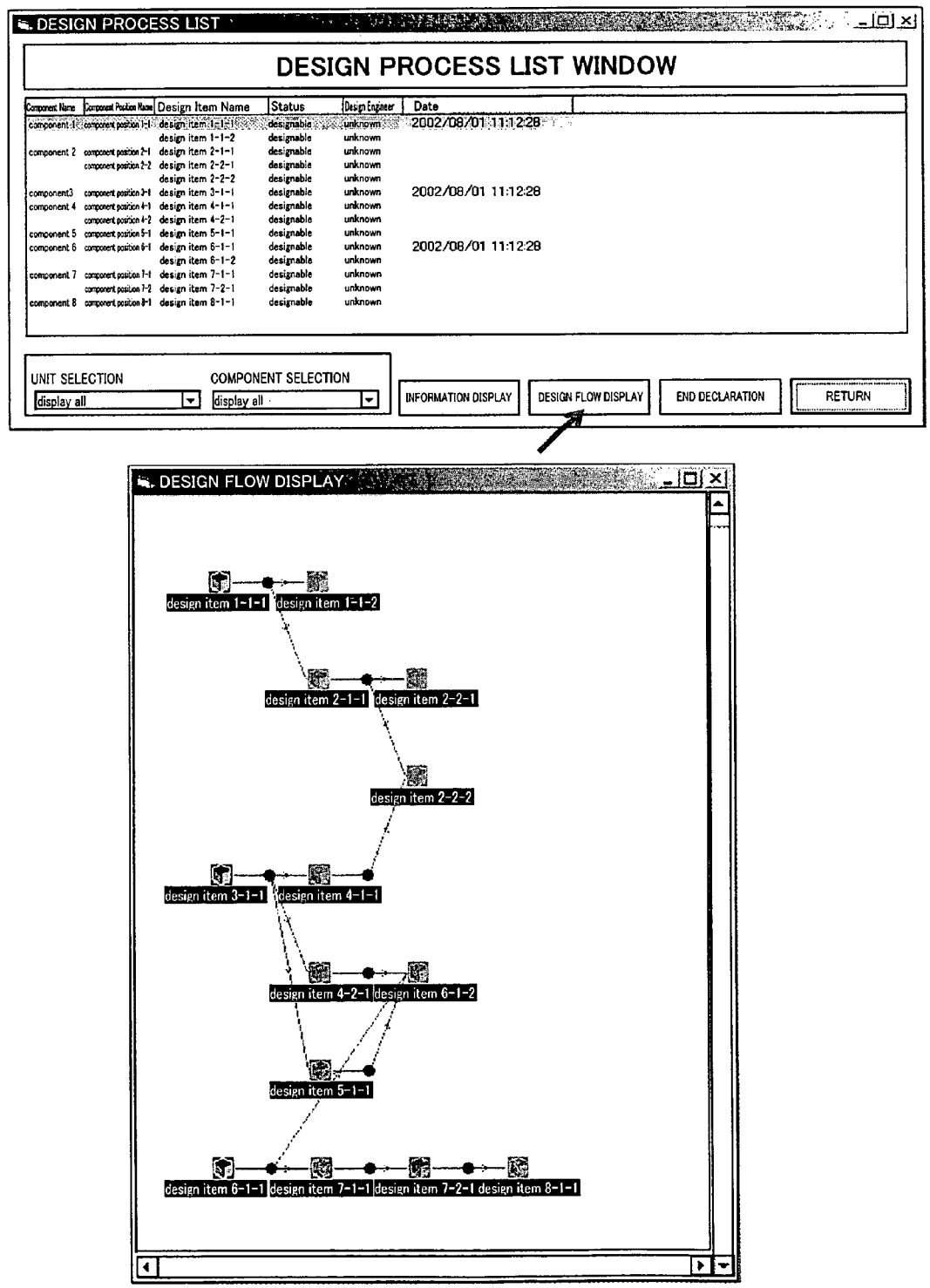
FIG. 24 is a diagram showing a window displaying design items to be designed for a "development-02" in the detailed design"

In response to clicking on the "development-02" of the dialog box in FIG. 23, design items of the detailed design to be designed for the "development-02" are displayed in the form of list as shown in FIG. 24 (S2205). The design items displayed as a list correspond to the design items in the design flow diagram illustrated in FIG. 19. An operator executing the detailed design can view the list in FIG. 24 to readily recognize a design item responsible to the operator for designing.

The list in FIG. 24 is provided with fields titled "Component Name", "Position Name", Design Item Name", "Status", Design Engineer" and "Date". The "Component name" field indicates to which of components a job for the target design item relates. The "Status" field is provided to indicate whether the target design item is in a status allowing its design job to be initiated. The name of a design engineer who will design or has designed the target design item is displayed on the "Design Engineer" field (the field in FIG. 24 is contingently displayed as "unknown"). The "Date" field displays a date when the target design item becomes "designable" or the job for the target design item is completed.

Whether the job for the target design item can be initiated is determined by whether the completion of another design item as a prerequisite for the initiating the target design item has been done. The three design items 1-1-1, 3-1-1 and 6-1-1 which are displayed as "designable" in FIG. 19 correspond to the three design items which are located at the leftmost position in the design flow diagram in FIG. 19 and capable of being initiated earlier than others. The operator may initiate any one of the three design items. The computer acquires the design item selectively clicked by the operator, and goes into the state allowing the job for the design item to be executed.

While not clearly shown in FIG. 24, the system according to this embodiment is configured such that the style and color of the display in the "Status" field are changed depending on the state of the target design item to provide enhanced visual discrimination. Specifically, in the "Status field, a "designable" design item is displayed in a normal display with blue, an "undesignable" design item being displayed with light gray, a design item completed in design job being displayed in the normal display with black, and a design item which is accessed from another computer and being designed being displayed in the normal display with red.

The system is configured such that in response to clicking on a "Design Flow Display" button on the underside of the dialog box in FIG. 24, approximately the same design flow diagram as that in FIG. 19 is displayed (S2206). Thus, the operator can readily refer to the design flow diagram according to need. In this displayed design flow diagram, the three design items which are presently "designable" are displayed in a flashing manner with a different color from those of other design items. This allows the operator to instantly figure out the current status in the entire design process.

In FIG. 24, when the operator clicks on either one of the three design items in which a design job can be initiated, the system recognizes as a state where the job for the clicked design item has been initiated (S2207). Then, if the uppermost "design item 1-1-1" is selected, a detailed design drawing of this design item as shown in FIG. 25 will be displayed.

Figure 25:
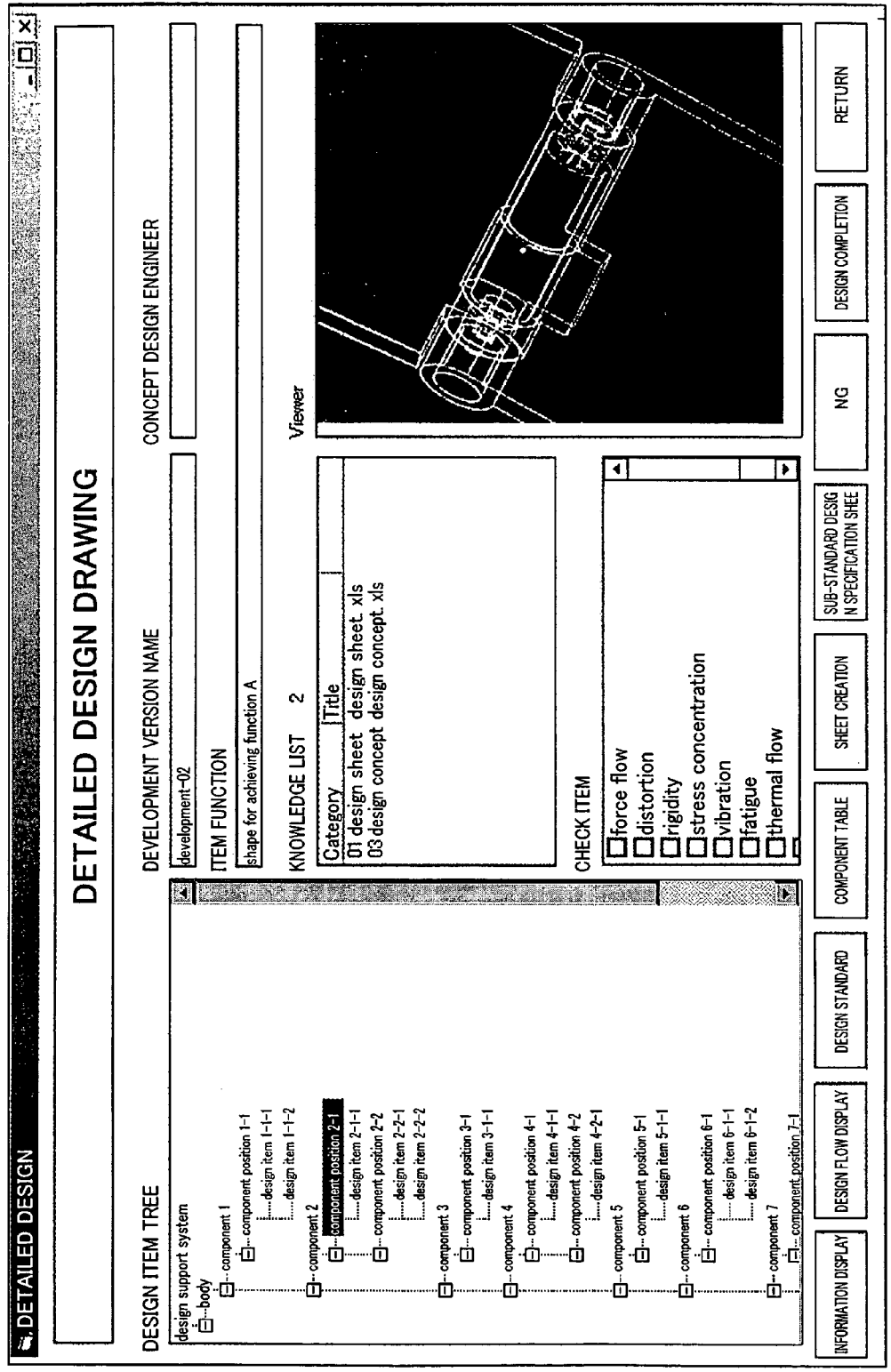
FIG. 25 is a diagram showing a detailed design window of a "design item 1-1-1" to be displayed when the "design item 1-1-1" is selected.

On the left field in FIG. 25, the entire design process is displayed in a tree structure Further, the job-pending "design item 1-1-1" is displayed in a highlighted manner, and other design items are displayed discriminately in the display style and color as with the "State" field of the list in FIG. 24. On the right field in FIG. 25, various informations about the "design item 1-1-1" are displayed. For example, the "development-02" as a project name of this development is displayed on a field titled "Development Version Name". The name of a associated concept design engineer is displayed on a field titled "Concept Design Engineer" (blank in FIG. 25), and the description on a function to be achieved in the design item is displayed on a field titled "Item Function".

While the window in FIG. 25 is configured to allow new information to be added in this stage, it is fundamentally intended to present information about the job content required for the design item to a detailed design engineer so as to guide or navigate the detailed design engineer. The engineer executes an actual design job while facing to a terminal of a CAD system or the like in conformity to the navigation according to this system.

In a field titled "Check Item" on the dialog box in FIG. 25, management items to be essentially executed by the engineer are listed. The engineer writes a check mark in a check box on the left side of each of the listed management items on the CAD system every time the job for one of the management items is completed (S2208, S2209). The system is also configured such that the job for the design item can be completed only after the check mark is written in all of the check boxes of the management items, according to a program (S2210). In this manner, even an inexperienced engineer who has not figured out key points to be studied in the design item can reliably execute a required job without lack of points to be checked. In the system according to this embodiment, the management items may be set up through the setup mode.

Further, in a filed titled "Viewer" on the right side of FIG. 25, an image of a partial drawing related to the design item is displayed. This image data is formed by extracting data corresponding to the design item from design data of the CAD system. Thus, the engineer can visually figure out to which portion of the development version his/her ongoing job corresponds While the engineer executes the design job on the CAD system according to instructions of the design navigation system, the two systems are generally independent to one another. In this case, if there is the need for switching the respective programs of the CAD system and the design navigation system in each case, or for moving from one to the other to use these systems because the two systems are located remote from one anther, such a need leads to deterioration in inefficiency. Thus, in view of operating efficiency, it is advantageous to allow design images on the CAD system to be referred on the design navigation system as in the system according to this embodiment.

Information listed on a field titled "Knowledge List" in the center of FIG. 25 corresponds to the "related knowhow" registered in the setup mode (see FIG. 10). The "Knowledge List" field includes documents described in a conventional file format such as Excel or Word, and informations useful in executing design jobs, such as knowhow and related patents, are described in the document files. Thus, the engineer can refer to these documents according to need (S2212).

Figure 26:
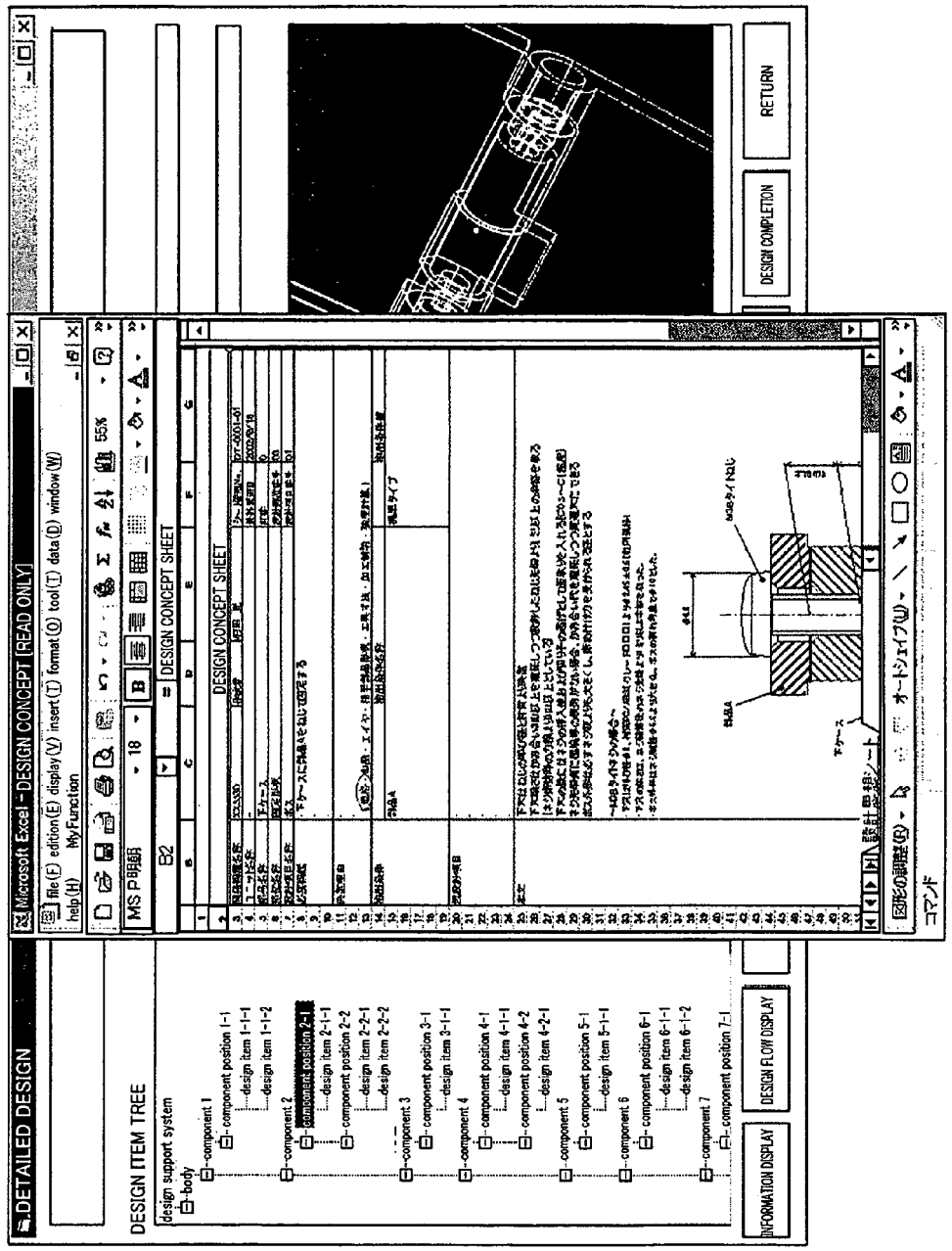
FIG. 26 is a diagram showing an image to be displayed in response to clicking on a document titled "design concept included in a "Knowledge List" field in FIG. 25.

As one example, FIG. 26 shows an image displayed in response to clicking on a document titled "design concept" on the "Knowledge List" field in FIG. 25. The document "design concept" is stored as an Excel file. The system is configured such that Excel is automatically activated in response to clicking on this document to automatically read the file name "design concept" and display the image as shown in FIG. 26. In this manner, the detailed design engineer can quickly refer to the information registered in the "Knowledge List" field while executing the design job. Thus, even an engineer who is insufficient in experience and knowledge of design jobs can executes a design job while refereeing to the knowhows and informations described in these documents, with high efficiently and at a standard or higher level.

Further, if the detailed design engineer has concerns or findings during the actual design job, he/she can register such knowledge as new knowhow to allow other engineers to refer thereto (S2214).

Figure 27:
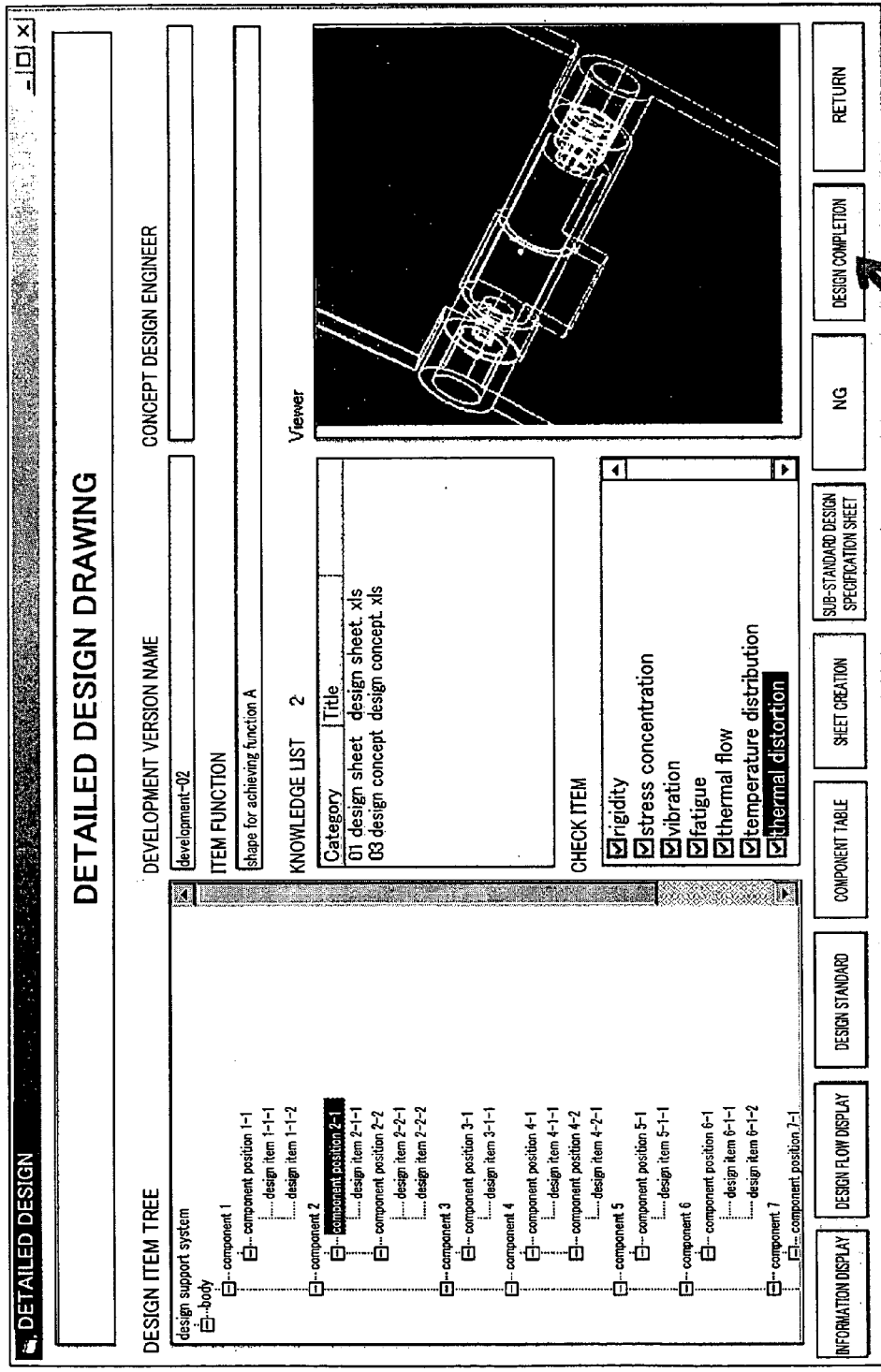
FIG. 27 is a diagram showing the state after a check mark is written in all items.

FIG. 27 shows the state when the check mark is written in all of the check boxes of the management items in FIG. 25 after the engineer executes the design job for each of the management items listed on the "Check Item" field and repeats an operation of clicking the check box of completed one of the management items, for example, while operating CAD software on other terminal than a terminal linked to this system.

Depending on design items, it is essentially required to enter a certain numerical value or letter through a keyboard or the like. Thus, while the "Check Item" field in FIG. 27 is configured to allow an engineer to write the check mark in the check box simply by clicking, it may be configured such that the check box can be clicked only after the above numerical value or letter is entered.

Further, when a management item essentially required to enter a certain numerical value or letter is set up in the setup mode, it may be set a limit on the numerical value, for example "only 3", "3 or more", "3 or less" or "3±1", which mean to allow only 3, only a value of 3 or more, only a value of 3 or less, or only a value in the range of 2 to 4 to be entered. That is, if a value deviating from the above limited value is entered for the management item, the check mark cannot be written in the checkbox of the management item to preclude the design job from going on any more. However, in the development of a new product, it is likely that a value deviating from the limit determined in the set up mode has to be entered for the right purpose. In order to avoid this problem, the system may be configured such that the check mark can be written in the check box of the management item on the condition that the path of a document concerning a reason for entering a value deviating from the limit, which is prepared using Word or Excel and stored in a given folder, is registered in a specific field on the Detailed Design Window".

When the check mark is written in all of the check boxes of the management items displayed on the "Check Item" field in FIG. 27, the system allows a "Design Completion" button on the bottom of FIG. 27 to be clicked. In this manner, this system can navigate the detailed design engineer while informing the engineer of what kind of design job is required in each stage, through a computer, so as to prevent even engineers inexperienced in design jobs from getting out of required design items.

Then, when the engineer clicks on "Design Complete" button (S2211), the dialog box in FIG. 27 is closed, and then another dialog box as shown in FIG. 28 is displayed. This dialog box is similar to but partly different from the dialog box in FIG. 24. Specifically, in the dialog box in FIG. 28, the "State" field of the "design item 1-1-1" is changed to "design completion", and simultaneously the "State" field of the "design item 1-1-2" is changed to "designable" and a normal display.

Figure 29:
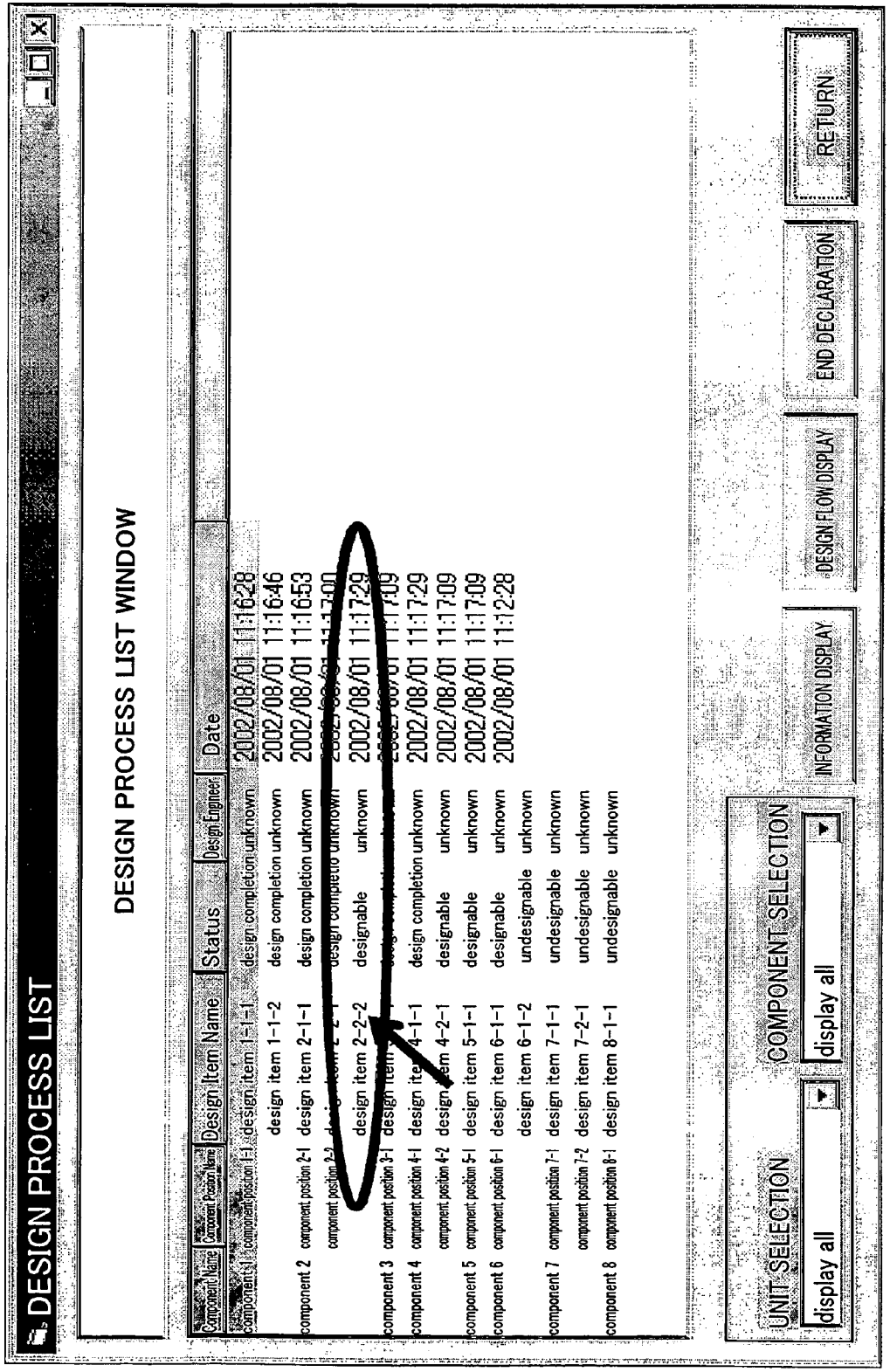
FIG. 29 is an explanatory diagram of a return function.

A "return" function (S2215) will be described below. When it is necessary to redo a previously completed design item in a stage where the task in the detailed design progress to a certain extent, this function is effective to return to a desired design item in a simple operation. FIG. 29 is an explanatory diagram of this "return" function. FIG. 29 shows the dialog box of the design process list. As seen in the "State" field in FIG. 29, the design items displayed on the dialog box include some previously completed design items (displayed as "design completion"), and some presently designable design items (displayed as "designable").

Figure 30:
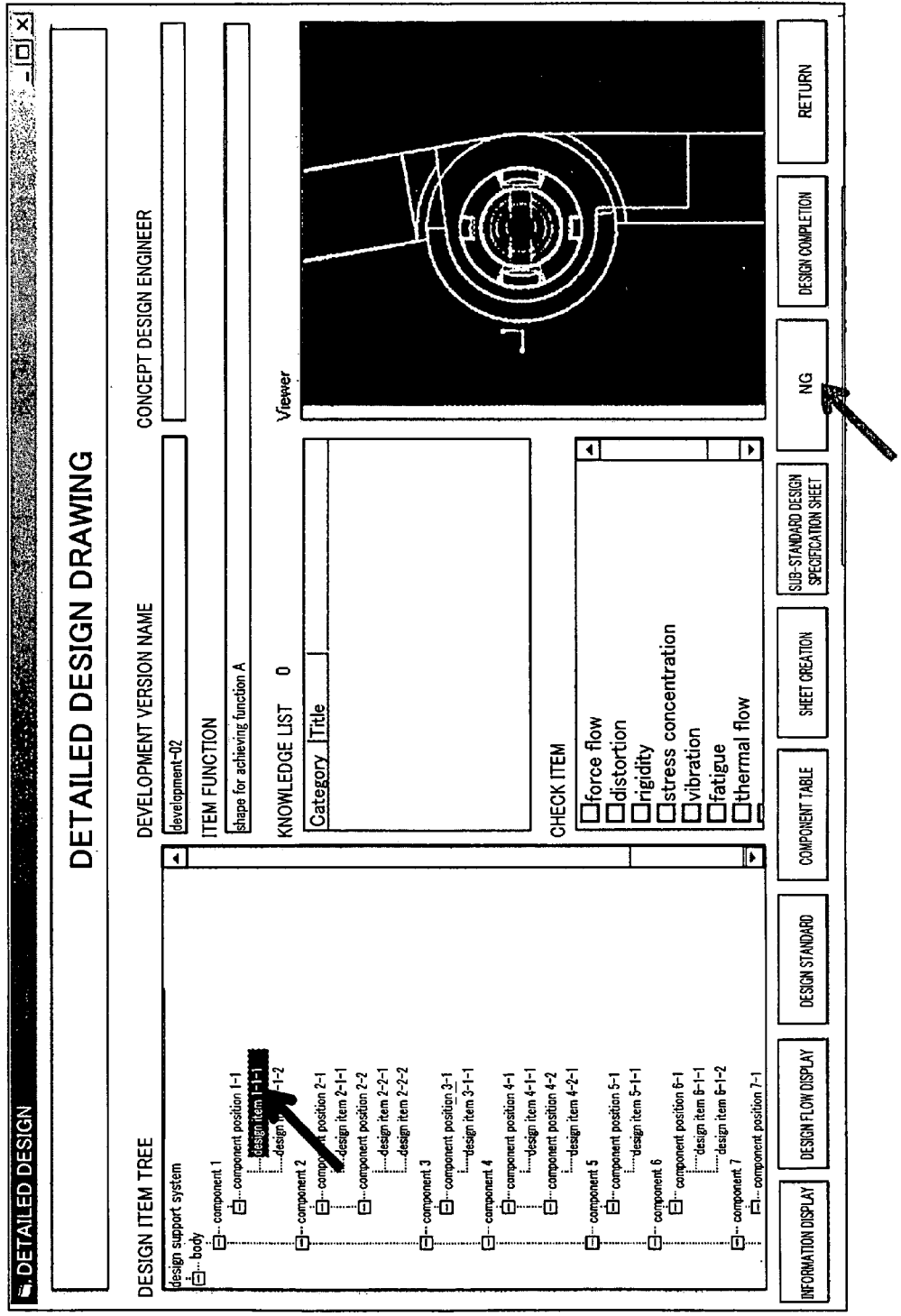
FIG. 30 is a diagram showing a dialog box to be displayed when a "design item 2-2-2" is designed.
Figure 31:
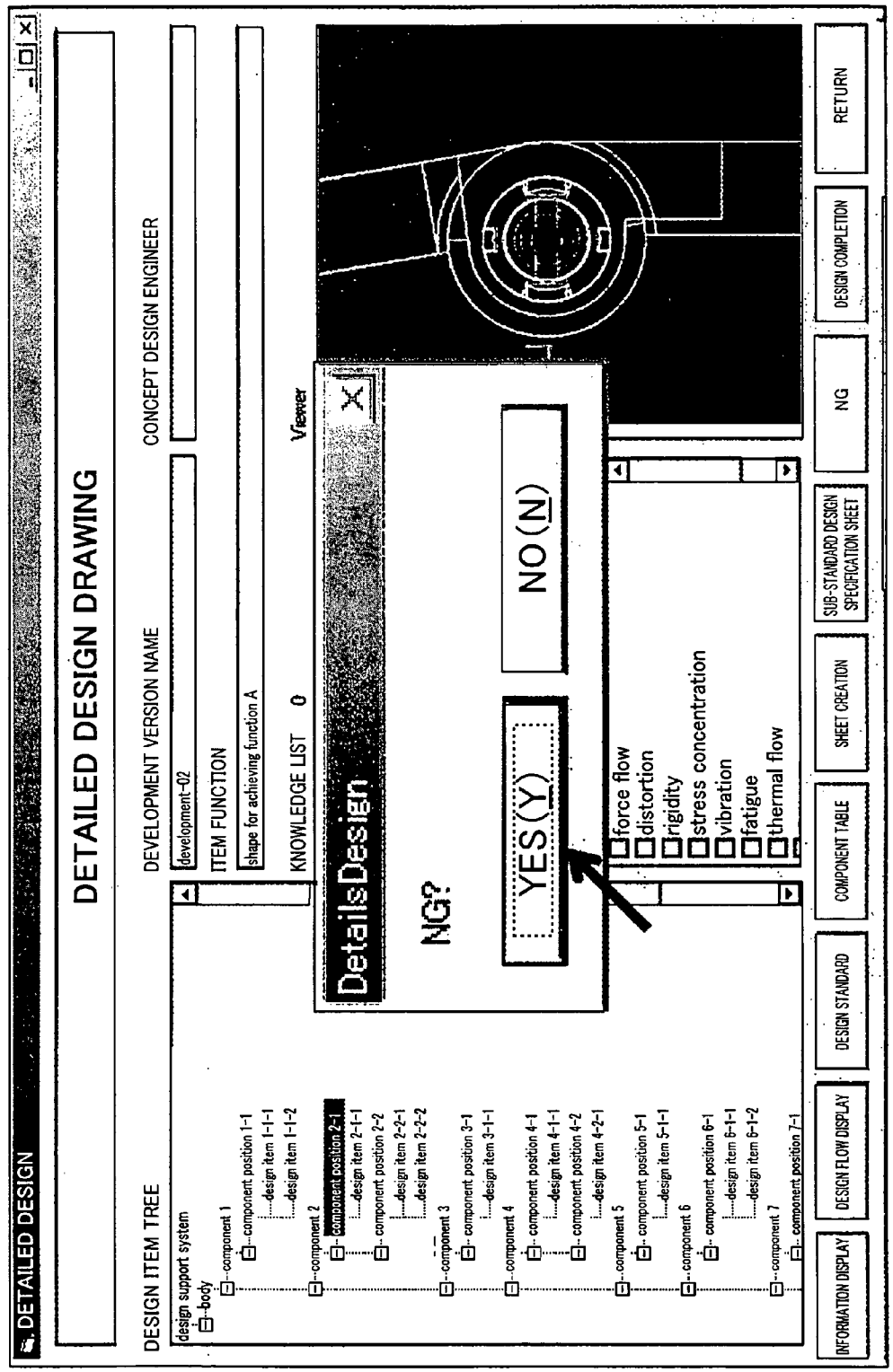
FIG. 31 is a diagram showing a confirmation window on execution of the return function.

Given that the design job is presently being executed on the "design item 2-2-2" displayed as "designable" in the "State" field. FIG. 30 shows a dialog box in the state when the design job for the "design item 2-2-2" is being executed. In this state, assume that the need for redoing the "design item 1-1-1" arises for some reason, and the design job for the "design item 1-1-1" will be redone using the return function. In this case, the "design item 1-1-1" in the tree structure on the left side of FIG. 30 is clicked and selected, and then a "NG" button is clicked. As a result, a confirmation window as shown in FIG. 32 is displayed, and a "YES" button is clicked to display a new "Design Process List Window" as shown in FIG. 32. As seen in FIG. 32, a new "design item 1-1-1" is added, or total two "design items 1-1-1" are displayed. As seen in the "Status" field, the added "design item 1-1-1" is displayed as "designable".

FIG. 33 shows the change in design flow between before and after the return function is used. In the design flow before the use of the return function, the "design item 2-2-2" is displayed as a presently executable design item. By contrast, in the design flow after the use of the return function, the "design item 2-2-2" is displayed with a color indicating "design completion", and inversely the "design item 1-1-1 is displayed as a presently executable design item. Thus, the need for redoing the jobs for the "design items 1-1-2, 2-1-1 and 2-2-1" arises. For example, when the "returned design item 1-1-1" is completed, the "design items 1-1-2 and 2-1-1" which becomes successively designable are displayed as an executable status in the design flow diagram in FIG. 33(b). When the design job is redone using the return function and completed, the design flow diagram is updated.

Figure 34:
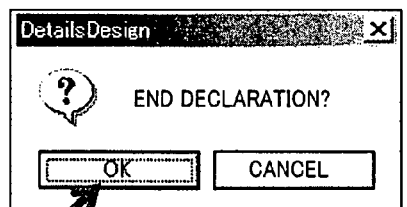
FIG. 34 is an explanatory diagram of an operation when all design items are completely designed.

The engineer goes on design jobs by repeating the above process. Then, when all of the design items are finally completed, or all of the "State" fields of the design items are displayed as "design completion", the system allows an "End Declaration" button to be clicked. Thus, when this button is clicked and then an "OK" button on a confirmation window as shown in FIG. 34(b) is clicked, the order "development-0" disappears from the "Order Select Window" as shown in FIG. 34(c). Through these operations, the detailed design is completed. In another embodiment, the system is configured such that when all of the "State" fields on the window in FIG. 34(a) are displayed as "design completion", this information is set to a concept design engineer, and the detailed design can be terminated only after the concept design engineer checks and approves the content of the detailed design.

The present invention is not limited to the above embodiment, but various modifications can be made without departing from the spirit and scope of the invention only defined by the appended claims. It is intended that such modifications are also encompassed within the scope of the present invention.

As mentioned above, according to the present invention, informations about design specifications, components, design items, the correlations between the design specifications and the components, and the correlations between the design items and the design specifications or between the design items and the component, which are required for designing a product, are registered in a database while giving given definitions to the informations. This makes it possible: to prompt a design engineer to determine the content of the design specification with respect to a specific version of the product; to extract components for the specific version from the database and present the extracted components to a design engineer so as to prompt the design engineer to determine components required for the specific version while performing addition, alteration and/or deletion the component if required; to extract design items required for the specific version and present the extracted design items to the design engineer; and to present specific job content of the extracted design item to a design engineer engineer, and navigate and prompt the design engineer to execute the job content. Thus, even a design engineer insufficient in knowledge about design procedure/practice and inexperienced in design of the product can execute a design job according to the contents of the navigation, at an average or higher level and within reduced design period of time.

What is claimed is:

1. A method for supporting an operator who performs mechanical design of a given product, by means of a computer, said method comprising:

a setup step registering in a database information about design specifications, components, design items, the correlations between said design specifications and said components, and the correlations between said design items and said design specifications or between said design items and said components, which are required for the mechanical design of said product, while giving given definitions to said informations on a computer;

a design-specification determination step presenting said design specifications to the operator so as to prompt the operator on a computer to determine the content of said design specifications required for said specific version of said product while performing addition, alteration and/or deletion on design specifications on the computer if required;

a component determination step extracting components for said specific version from said database in accordance with said design specification-component correlations registered in said setup step, and presenting said extracted components to the operator on a computer so as to prompt said operator to determine components required for said specific version while performing addition, alteration and/or deletion on components if required;

a design-item determination step using a computer to extract design items in accordance with said design item-design specification correlations or said design item-component correlations registered in said setup step, presenting said extracted design items to the operator, and then prompting said operator to determine design items required for said specific version while performing addition, alteration and/or deletion on design items if required; and a design-item execution step using a computer to present to the operator specific job content of each of said design items determined in said design-item determination step, and to navigate and to prompt said operator to execute said job content.

2. The method as defined in claim 1, wherein said set-up step includes defining the relationship between said design items so that any of said design items which must have been completed to enable one or more of the remaining design items to be executed is defined as a parent item, or any of said design items which becomes executable only after the completion of one or more of the remaining design items is defined as a children item, wherein a design flow diagram for the design items determined in said design-item determination step is created on a computer in accordance with said information about each parent item or each children item and presented to the operator, and then the operator is prompted to determine the design flow on the computer while performing addition, alteration and/or deletion on design items if required.

3. The method as defined in claim 1, wherein said setup step includes storing a document related to one or more of said design items, and data on the correlation between said document and said one or more design items, wherein said design-item execution step includes extracting the content of the document correlated with the design item subject to a specific job to be executed by the operator, if any, in accordance with said correlation data, and presenting said document to the operator.

4. The method as defined in claim 2, wherein said setup step includes storing a document related to one or more of said design items, and data on the correlation between said document and said one or more design items, wherein said design-item execution step includes extracting the content of the document correlated with the design item subject to a specific job to be executed by the operator, if any, in accordance with said correlation data, and presenting said document to the operator.

5. A system for supporting an operator who performs the mechanical design of a given product, by means of a computer, said system comprising:

setup means for registering in database information design specifications, components, design items, the correlations between said design specifications and said components, and the correlations between said design items and said design specifications or between said design items and said components, which are required for the mechanical design of said product, while giving given definitions to said information;

design-specification determination means for presenting the said design specification and prompting the operator to determine the content of said design specifications with respect to a specific version of said product while performing addition, alteration and/or deletion on design specifications if required;

component determination means for extracting components for said specific version from said database in accordance with said design specification-component correlations registered by said setup means, and presenting said extracted components to the operator so as to prompt said operator to determine components required for said specific version while performing addition, alteration and/or deletion on components if required;

design-item determination means for extracting design items required for said specific version from said database in accordance with said design item-design specification correlations or said design item-component correlations registered by said setup means, presenting said extracted design items to the operator, and prompting the operator to determine the design items while performing addition, alteration and/or deletion on design items if required; and design-item execution means for presenting to the operator a specific job content of each of said design items determined by said design-item determination means, and prompting said operator to execute said job content.

6. The system as defined in claim 5, wherein said set-up means is operable to define the relationship between said design items so that any of said design items which must have been completed to enable one or more of the remaining design items to be executed is defined as a parent item, or any of said design items which becomes executable only after the completion of one or more of the remaining design items is defined as a children item, wherein said system includes means for creating a design flow diagram for the design items determined by said design-item determination means in accordance with said information about each parent item or each children item, presenting said design flow diagram to the operator and prompting the operator to determine the design flow on the computer while performing addition, alteration and/or deletion on design items if required.

7. The system as defined in claim 5, wherein said setup means is operable to store a document related to one or more of said design items, and data on the correlation between said document and said one or more design items,
wherein said design-item execution means is operable to extract the content of the document correlated with the design item subject to a specific job to be executed by the operator, if any, in accordance with said correlation data, and to present said document to the operator.

8. The system as defined in claim 6, wherein said setup means is operable to store a document related to one or more of said design items, and data on the correlation between said document and said one or more design items,
wherein said design-item execution means is operable to extract the content of the document correlated with the design item subject to a specific job to be executed by the operator, if any, in accordance with said correlation data and to present said document to the operator.

9. A computer program product comprising computer-readable medium having executable instructions embodied therein for supporting an operator who performs the mechanical design of a given product, said executable instructions including:
a setup function that registers in a database informations about design specifications, components, design items, the correlations between said design specifications and said components, and the correlations between said design items and said design specifications or between said design items and said components, which are required for the mechanical design of said product, while giving given definitions to said informatione according to the operation of the operator;
a design-specification determination function that prompts the operator to determine the content of said design specifications with respect to a specific version of said product;
a component determination function that extracts components for said specific version from said database in accordance with said design specification-component correlations registered by said setup function, and presents said extracted components to the operator so as to prompt said operator to determine components required for said specific version while performing addition, alteration and/or deletion on components if required;
a design-item extration function that extracts design items required for said specific version in accordance with said design item-design specification correlations or said design item-component correlations registered by said setup function, and presenting said extracted design items to the operator; and
a design-item execution function that presents to the operator a specific job content of each of said design items extracted by said design-item extraction function, and navigates and prompts said operator to execute said job content.

10. The computer program product as defined in claim 9, wherein said set-up function defines the relationship between said design items so that any of said design items which must have been completed to enable one or more of the remaining design items to be executed is defined as a parent item, or any of said design items which becomes executable only after the completion of one or more of the remaining design items is defined as a children item,
wherein said computer program product wherein the executable instructions include a function that creates a design flow diagram for the design items extracted in said design-item extraction function in accordance with said information about each parent item or each children item, and presents said design flow diagram to the operator.

11. The computer program product as defined in claim 9, wherein said setup function stores a document related to one or more of said design items, and data on the correlation between said document and said one or more design items, wherein said design-item execution function extracts the content of the document correlated with the design item subject to a specific job to be executed by the operator, if any, in accordance with said correlation data, and presents said document to the operator.

12. The computer program product as defined in claim 10, wherein said setup function stores a document related to one or more of said design items, and data on the correlation between said document and said one or more design items, wherein said design-item execution function extracts the content of the document correlated with the design item subject to a specific job to be executed by the operator, if any, in accordance with said correlation data, and presents said document to the operator.

* * * * *